United States Patent
Hou et al.

(10) Patent No.: US 12,234,398 B2
(45) Date of Patent: Feb. 25, 2025

(54) METAL ORGANIC FRAMEWORK (MOF) GLASS COMPOSITE COMPRISING METAL HALIDE PEROVSKITE

(71) Applicants: THE UNIVERSITY OF QUEENSLAND, Queensland (AU); Cambridge Enterprise Limited, Cambridge (GB)

(72) Inventors: Jingwei Hou, Queensland (AU); Vicki Chen, Queensland (AU); Lianzhou Wang, Queensland (AU); Thomas D. Bennett, Cambridge (GB); Peng Chen, Queensland (AU)

(73) Assignees: THE UNIVERSITY OF QUEENSLAND, Queensland (AU); CAMBRIDGE ENTERPRISE LIMITED, Cambridge (GB)

( * ) Notice: Subject to any disclaimer, the term of this patent is extended or adjusted under 35 U.S.C. 154(b) by 0 days.

(21) Appl. No.: 18/687,685

(22) PCT Filed: Aug. 30, 2022

(86) PCT No.: PCT/AU2022/051057
§ 371 (c)(1),
(2) Date: Feb. 28, 2024

(87) PCT Pub. No.: WO2023/028644
PCT Pub. Date: Mar. 9, 2023

(65) Prior Publication Data
US 2024/0376377 A1 Nov. 14, 2024

(30) Foreign Application Priority Data

Aug. 31, 2021 (AU) .................. 2021902824

(51) Int. Cl.
C09K 11/66 (2006.01)
C09K 11/06 (2006.01)
C09K 11/61 (2006.01)

(52) U.S. Cl.
CPC ............ *C09K 11/06* (2013.01); *C09K 11/665* (2013.01); *C09K 2211/1029* (2013.01)

(58) Field of Classification Search
CPC ........................... C09K 11/616; C09K 11/665
See application file for complete search history.

(56) References Cited

FOREIGN PATENT DOCUMENTS

| CN | 112619709 A | | 4/2021 |
|---|---|---|---|
| KR | 20210055883 | * | 5/2021 |
| WO | 2021037428 A1 | | 3/2021 |

OTHER PUBLICATIONS

Bikash Kumar Shaw et al., "Melting of hybrid organic-inorganic perovskites", Nature Chemistry 13, May 10, 2021, pp. 778-785.
Chen et al., "A Confined Fabrication of Perovskite Quantum Dots in Oriented MOF Thin Film", ACS Appl. Mater. Interfaces, 2016, vol. 8, pp. 28737-28742.

(Continued)

*Primary Examiner* — Matthew E. Hoban
(74) *Attorney, Agent, or Firm* — Nixon & Vanderhye, PC

(57) ABSTRACT

The present application relates to a metal organic framework (MOF) glass composite comprising metal halide perovskite, and a method for its preparation.

20 Claims, 12 Drawing Sheets

(56) References Cited

OTHER PUBLICATIONS

Hou et al., "Intermarriage of Halide Perovskites and Metal-Organic Framework Crystals", Angewandte Chemie, 2020, 59 (44), 1.2. Why metal-organic frameworks; 2.2. Building-bottle-around-ship strategy, pp. 19434-19449.
Li et al., "Mechanical Properties and Processing Techniques of Bulk Metal-Organic Framework Glasses", J. Am. Chem. Soc., 2019, vol. 141, pp. 1027-1034.
International Search Report for PCT/AU2022/051057 mailed Nov. 1, 2022, 5 pages.
Written Opinion of the ISA for PCT/AU2022/051057 mailed Nov. 1, 2022, 4 pages.
Examination Report No. 1 dated Mar. 26, 2024, issued in Australia Patent Application No. 2022335914, 4 pages.

\* cited by examiner (a)

(b)

METAL ORGANIC FRAMEWORK (MOF) GLASS COMPOSITE COMPRISING METAL HALIDE PEROVSKITE

CROSS-REFERENCE TO RELATED APPLICATIONS

This application is the U.S. national phase of International Application No. PCT/AU2022/051057 filed Aug. 30, 2022 which designated the U.S. and claims priority to AU 2021902824 filed Aug. 31, 2021, the entire contents of each of which are hereby incorporated by reference.

FIELD OF THE INVENTION

The invention relates generally to composite materials, and in particular to a composite comprising metal halide perovskite.

BACKGROUND OF THE INVENTION

Metal halide perovskites have attracted great attention for applications in photovoltaics, light-emitting diodes, radiation detection, and thermometry due to their appealing optoelectronic properties. In that regard, metal halide perovskites exhibit tuneable bandgaps, long charge carrier lifetimes, as well as narrow-band and bright photoluminescence (PL). Those attributes make metal halide perovskites attractive for use as active materials in opto-electric devices over conventional binary II-VI, III-V and IV-VI semiconductors.

The practical application of metal halide perovskites nevertheless faces significant barriers, which are mainly related to the tendency of metal halide perovskites to (i) readily decompose upon exposure to moisture, heat, light, oxygen and polar solvents, (ii) leach toxic heavy metal ions, (iii) present a high concentration of deep trap electronic states, and (iv) inherent polymorphism in their crystal structures.

In an attempt to minimise the adverse impact of the aforementioned limitations, there has been reports of stabilising strategies based on the formation of a protective shell of organic ligands around a metal halide perovskite particulate core. However, while the provision of a passivating shell assists to maintain the opto-electronic integrity of the metal halide perovskite cores, the stabilisation is short-lived, the fabrication is complex, and the processability is limited.

Alternative strategies involve the fabrication of composite materials in which metal halide perovskites are immobilised on passivating substrates. However, the inherent ionic nature of metal halide perovskites is not conducive to composite fabrication. Significant functional penalties can be incurred within the composite material, including aggregation/decomposition of the metal halide perovskite, poor mechanical stability of the composite due to weak interfacial bonding with the chosen matrix, and the formation of high concentrations of electronic defects (trap states).

There remains therefore an opportunity to develop metal halide perovskite-based materials that can address the limitations of those of the prior art.

SUMMARY OF THE INVENTION

The present invention provides a metal organic framework (MOF) glass composite comprising metal halide perovskite.

By a "MOF glass" is meant that the MOF is solid amorphous MOF (also referred herein as "aMOF"). Accordingly, the MOF glass used and that which forms part of the composite displays a thermally induced solid-liquid transition associated with amorphous MOF.

By the MOF glass being a "composite" is meant that the MOF glass presents in combination with the metal halide perovskite. For example, the MOF glass composite of the invention may be in the form of a solid amorphous MOF matrix having metal halide perovskite particles distributed therethrough.

Providing the metal halide perovskite in composite form with MOF glass has advantageously been found to prevent or at least significantly inhibit one or more of (i) decomposition of the metal halide perovskite upon long term exposure to moisture, heat, light, and polar solvents, (ii) leaching of toxic heavy metal ions, (iii) formation of deep trap electronic states, and (iv) polymorphic transitions of the metal halide perovskite to optically-inactive crystalline phases.

It has surprisingly been found that relative to other supports, such as crystalline MOFs, MOF glass can offer superior chemical, optoelectronic, thermal and morphological stabilisation of metal halide perovskites. In addition, MOF glass offers significantly higher molecular and morphological flexibility relative to their crystalline counterparts, favourable for macroscopic devices. As a result, amorphous MOF can passivate surface-defects of the metal halide perovskite more effectively.

For example, in contrast to their crystalline MOF counterparts, MOF glasses are not hindered by rigid structural constraints and can easily morph around the morphological features of the perovskite. As a result, surface passivation of the metal halide perovskite is more efficient. Also, the stronger and more extended interfacial interactions between MOF glass and the metal halide perovskite result in a significant increase of the mechanical stability of the composite.

Accordingly, the invention may also be understood to relate to a MOF glass composite comprising a MOF glass matrix having a metal halide perovskite encapsulated therein.

In some embodiments, the MOF glass is a zeolitic imidazolate framework (ZIF) glass. In those embodiments, the amorphous component of the MOF glass composite is therefore solid amorphous ZIF (also referred to herein as "aZIF"). Due to their chemical stability, aZIFs can effectively protect metal halide perovskites against water and organic solvents, as well as ensure mechanical and thermal stability of the resulting glass composites. In addition, the high processability of aZIFs make them ideal candidates for large scale production of the ZIF-perovskite glass composites.

Specific interfacial interactions between aZIFs and metal halide perovskites not only can stabilize metastable and optically-active polymorphic perovskite phases, but also passivate both Lewis acid and base surface defects of the perovskite, allowing electron transfer within such heterostructures. The interfacial interactions between amorphous ZIFs and metal halide perovskites has also been observed to advantageously passivate under-coordinated metal or halide sites and negatively charged metal-halide anti-sites at the surface of the metal halide perovskite.

Due to its structural flexibility, MOF glass described herein has been found to be an effective passivating support for a variety of metal halide perovskites. Accordingly, the composite of the invention may comprise a metal halide perovskite which is one or more of lead halide perovskite, tin halide perovskite, germanium halide perovskite, and double perovskite (such as silver-bismuth halide double perovskite). In some embodiments, the metal halide perovskite is selected from one or more of $CsPbI_3$, $CsPbBr_3$, $CsPbCl_2Br$, $CsPbCl_{1.5}Br_{1.5}$, $MAPbI_3$, $MAPbBr_3$, $FAPbI_3$, $(C_4H_9NH_3)_2PbBr_4$, $CsPbCl_2Br$, $CsPbCl_{1.5}Br_{1.5}$, $CsPbClBr_2$, $CsPbCl_{0.75}Br_{2.25}$, $CsPbCl_{0.5}Br_{2.5}$, $CsPbBr_{2.5}I_{0.5}$, $CsPbBr_{2.25}I_{0.75}$, $CsPbBr_2I$, $CsPbBr_{1.5}I_{1.5}$, $CsPbBrI_2$, $CsPbBr_4^{4-}$, $(MAPbI_3)_{0.95}(FAPbI_3)_{0.05}$, and 2D perovskites, in which MA is methylammonium and FA is formamidinium.

The present invention also provides a method of making a MOF glass composite comprising metal halide perovskite, the method comprising the steps of (a) blending MOF and the metal halide perovskite to obtain a precursor blend, (b) sintering the precursor blend such that the MOF liquefies and coats the metal halide perovskite, and (c) quenching the sintered precursor blend so as to vitrify the liquefied MOF and form the MOF glass composite.

The combination of the proposed method steps promotes formation of amorphous MOF that can effectively passivate the guest perovskite. By sintering the precursor blend so as to form liquefied MOF around the metal halide perovskite, the MOF embeds the metal halide perovskite. As the sintered blend is quenched, the liquefied MOF vitrifies and consolidates in its amorphous form to provide the final structure of the MOF glass composite.

By promoting sintering and subsequent vitrification of MOF, the proposed method overcomes inherent limitations of procedures that attempt to encapsulate perovskites within crystalline MOFs. Since vitrified MOF does not possess the rigid microstructure of corresponding crystalline MOFs, there are no structural constraints to limit the range and morphologies of metal halide perovskites that can be encapsulated within a MOF. The method of the invention therefore advantageously enables a large variety of MOFs can now be combined with a large range of metal halide perovskites.

Provided the sintering and quenching steps result in formation of MOF glass, MOF used in the precursor blend may be crystalline MOF, MOF glass, or both. In some embodiments, the MOF in the precursor blend comprises at least one of crystalline MOF and MOF glass. For example, the precursor blend may comprise at least one of crystalline MOF particulate and MOF glass particulate. In some embodiments, the precursor blend consists essentially of MOF glass particulate.

Advantageously, combining sintering and quenching can also effectively reduce the bulk crystal defects of metal halide perovskites in the resulting MOF glass composite. That is reflected in the significant crystallinity enhancement observed for perovskites used in the proposed method. In that regard, it has been observed that higher quenching rates afford lower defect density in the crystalline structure of the metal halide perovskite. Combining sintering and quenching made it also possible to access and stabilise within the vitrified MOF glass optically-active crystalline phases of the metal halide perovskites (which are inherently meta-stable).

In some embodiments, the precursor blend is sintered to at least 100° C. Those sintering temperatures have proven particularly advantageous to achieve effective MOF liquefaction and, when crystalline MOF is used in the blending step, amorphisation. Advantageously, the proposed sintering temperatures also allow to access optically-active crystalline phases of the metal halide perovskite.

In some embodiments, the sintered precursor blend is quenched at a quenching rate of at least 20° C./minute. Those conditions can be particularly advantageous to minimise defect density in the crystalline structure of the metal halide perovskite in the resulting MOF glass composite.

Vitrified MOF glass represents a robust host that can provide an effective and potentially microporous physical barrier to protect the metal halide perovskite host against external perturbation or degradation. As a result, the MOF glass composite of the invention represent a step forward toward the large-scale practical applicability of metal halide perovskite-based materials for applications in, for example, optoelectronics, catalysis, sensing, and data encryption. Due to its structural and chemical stability, the vitrified MOF glass can effectively protect the metal halide perovskite against exposure to organic solvents (e.g. non-polar, polar-protic, polar-aprotic), heat, water, and mechanical stress.

Further aspects and/or embodiments of the invention are discussed in more detail below.

BRIEF DESCRIPTION OF THE DRAWINGS

Embodiments of the invention will be now described with reference to the following non-limiting drawings, in which.

DETAILED DESCRIPTION OF THE INVENTION

Figure 1:
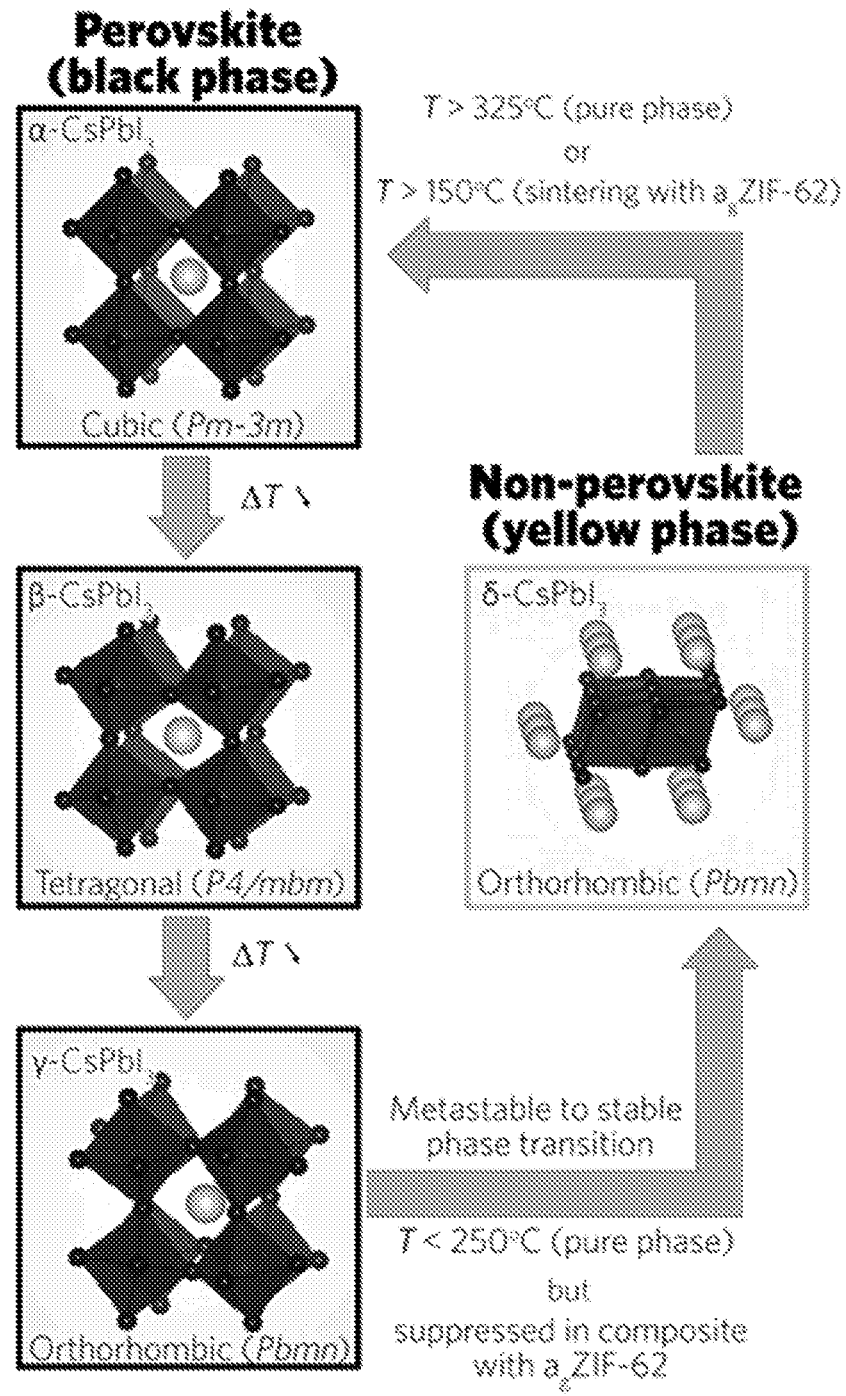
FIG. 1 shows a schematic of crystalline phase transitions, and corresponding transition temperatures, of $CsPbI_3$ either as pure compound or provided as guest phase in a $(CsPbI_3)(a_gZIF-62)$ composite.

The present invention provides a metal organic framework (MOF) glass composite.

As they are known in the art, MOFs are hybrid coordination structures formed by metal clusters comprising metal ions (e.g. metal ions or metal oxides) coordinated by multi-functional organic ligands. This results in the formation of one-, two- or three-dimensional structures that can be highly porous.

Conventionally, the field of MOFs is dominated by crystalline MOFs, in which metal clusters are coordinated by multi-functional organic ligands to form highly ordered crystal structures and motifs leading to materials exhibiting ultrahigh surface areas. In contrast, by being a "MOF glass", the MOF is solid amorphous MOF (also referred herein as "aMOF").

Solid amorphous MOFs (also referred to as "aMOFs") retain the basic building blocks and connectivity of their crystalline counterparts, though they lack any long-range periodic order. In aMOFs, metal clusters and multi-functional organic ligands form a framework that does not have detectable spatial order. Due to their aperiodic arrangement of atoms, aMOFs generate X-ray diffraction patterns that do not present the sharp Bragg diffraction peaks typical of their crystalline correspondents, and are instead dominated by broad 'humps' caused by diffuse scattering. As a result, aMOFs are largely indistinguishable from one another by means of XRD diffraction measurements.

Presence of both inorganic and organic domains within aMOFs provide a variety of opportunities for tuning physicochemical properties of the MOF glass composites of the invention, such as porosity, phase transition behavior, affinity, mechanical rigidity/ductility and optics.

Suitable amorphous MOFs for use in the invention display reversible solid-liquid transitions upon heating below their thermal decomposition point, which is analogous to transitions observed in, for instance, amorphous silica. Thermally induced solid-liquid transitions in aMOFs are mediated by the at least partial breaking of metal-ligand coordinate bonds, which nevertheless preserves the integrity of both the inorganic and organic building units in the liquid phase. Macroscopically, the solid-liquid transition displayed by aMOFs is associated with the transition to a soft, flowable and liquid-like state before the MOF reaches thermal decomposition.

Examples of metal ions forming part of the structure of an aMOFs suitable for use in the invention include Zn$^{2+}$, Co$^{3+}$, Co$^{2+}$, Ni$^{2+}$, Pd$^{4+}$, Pd$^{2+}$, Pt$^{4+}$, Pt$^{2+}$, Cu$^{2+}$, Cu$^+$, Na$^+$, Fe$^{3+}$, Fe$^{2+}$, Os$^{2+}$, Ir$^{2+}$, Ag$^+$, and a combination thereof.

Examples of multi-functional organic ligands forming part of the structure of an aMOF suitable for use in the invention include imidazolate, 2-methylimidazolate, 2-nitroimidazolate, 5-chlorobenzimidazolate, 4-methyl-5-nitroimidazolate, imidazolate-2-carboxaldehyde, imidazole-4,5-dicarboxylate, benzene-1,4-dicarboxylate, 1,3,5-tris(4'-carboxyphenyl)benzene, 2,4,6-tris(4-pyridyl)triazine), and a combination thereof.

Further examples of amorphous MOFs suitable for use in the present invention, and corresponding methods of synthesis, include those described in Bennett et al., *Nature Reviews Materials*, 3, 431-440 (2018), and Bennett et al., *Accounts of Chemical Research*, 47, 1555-1562 (2014).

In some embodiments, the MOF is a mixed component MOF (also known as "mixed-ligand" MOF). Mixed components MOFs have a structure that is characterised by more than one kind of organic ligand and/or metal.

In some embodiments, the aMOF is an amorphous zeolitic imidazolate framework (aZIF). From the structural standpoint, amorphous ZIFs are non-crystalline three-dimensional frameworks made of tetrahedral mono-, di- or trivalent transition metal ions linked by imidazolate-based ligands. Amorphous ZIFs for use in the invention include therefore those having said structure and that can display a thermally induced reversible solid-liquid transition below their decomposition temperature.

Examples of ZIFs suitable for use in the invention include those having an amorphous structure in which tetrahedral Zn$^{2+}$ or Co$^{2+}$ are coordinated by imidazolate-based bridging units. For example, amorphous ZIFs suitable for use in the invention include those in which tetrahedral Zn$^{2+}$ or Co$^{2+}$ are coordinated by bridging units such as imidazolate ("Im", C$_3$H$_3$N$_2^-$), 2-methylimidazolate ("mIm", C$_4$H$_5$N$_3^-$), 2-nitroimidazolate ("nIm", C$_3$H$_2$N$_3$O$_2^-$), benzimidazolate ("bIm", C$_7$H$_5$N$_2^-$), 5-chlorobenzimidazolate ("cbIm", C$_7$H$_4$N$_2$Cl$^-$), 5-methylbenzimidazolate ("5-mbIm", C$_8$H$_7$N$_2^-$), 4-methyl-5-nitroimidazolate ("mnIm", C$_4$H$_4$N$_3$O$_2^-$), imidazolate-2-carboxaldehyde ("ICA", C$_4$H$_3$N$_2$O$^-$), or imidazole-4,5-dicarboxylate ("ImDC", C$_5$HN$_2$O$_4^-$).

In some embodiments the amorphous ZIF is selected from those known in the art as aZIF-1, aZIF-3, aZIF-4, aCo-ZIF-4, aZIF-8, aZIF-62, aZIF-76, aZIF-69, aZIF-UC-2, aZIF-UC-3, aZIF-UC-4, aZIF-UC-5, and a combination thereof.

In some embodiments, the aZIF is aZIF-4. This aZIF display a reversible solid-liquid transition at around 292° C., making it highly processible. Structurally, aZIF-4 is characterised by Zn$^{2+}$ centres coordinated to four imidazolate ligands to form, unlike in the corresponding crystalline form, a continuous random network topology similar to that of amorphous SiO$_2$.

In some embodiments, the aZIF is aZIF-62. Structurally, aZIF-62 is characterised by Zn$^{2+}$ centres coordinated by benzimidazolate ligands ("bIm", C$_7$H$_5$N$_2^-$) to form Zn(Im)$_{1.75}$(bIm)$_{0.25}$ framework. Similar to aZIF-4, aZIF-62 is highly processable due to its inherently low reversible solid-liquid transition temperature (about 430° C.). In addition, aZIF-62 presents a large temperature range over which the resultant liquid is stable before decomposing at about 550° C. The use of aZIF-62 is also advantageous due to the extremely stability of aZIF-62 against crystallisation, which is ascribed to the high viscosity of its liquid phase. Those characteristics make ZIF-62 particularly useful in the composite of the invention to achieve effective surface passivation and protection of the metal halide perovskite.

In some embodiments, the aZIF is a mixed-ligand aZIF. In mixed-ligand aZIFs, the metal centres are coordinated by at least two different kind of multi-functional organic ligand. The use of mixed-ligand aZIFs can be particularly advantageous. By modifying the nature and relative amount of the organic ligands it is possible to tune the solution-liquid transition temperature of the MOF glass composite. Examples of mixed-ligand aZIFs suitable for use in the invention include those obtained by substituting a fraction of the conventional ligands for a given aZIF with a functionalised ligand, such as a halogenated ligand. The halogenated ligand may be a benzimidazolate-derived ligand. The benzimidazolate-derived ligand may be selected from 5-chlorobenzimidazolate ("5-ClbIm", $C_7H_4N_2Cl^-$), 5-chloro-2-methylbenzimidazolate ("5-Cl-2-mbIm", $C_8H_6N_2Cl^-$), 5-fluorobenzimidazolate ("5-FbIm", $C_7H_4N_2F^-$), and 6-chloro-5-fluorobenzimidazolate ("6-Cl-5-FbIm", $C_7H_3N_2ClF^-$).

In some embodiments, the aZIF is a mixed-ligand aZIF based on aZIF-62 in which a fraction of benzimidazolate ligand in aZIF-62 is substituted with a benzimidazolate-derived ligand, for example one selected from 5-chlorobenzimidazolate ("5-ClbIm", $C_7H_4N_2Cl^-$), 5-chloro-2-methylbenzimidazolate ("5-Cl-2-mbIm", $C_8H_6N_2Cl^-$), 5-fluorobenzimidazolate ("5-FbIm", $C_7H_4N_2F^-$), and 6-chloro-5-fluorobenzimidazolate ("6-Cl-5-FbIm", $C_7H_3N_2ClF^-$). Examples of such mixed-ligand aZIFs and corresponding methods of synthesis are described in Hou et al., "Halogenated Metal-Organic Framework Glasses and Liquids", *Journal of the American Chemical Society* 2020, 142, 3880-3890, the content of which is incorporated herein in its entirety.

The composite of the invention comprises metal halide perovskite.

The term "perovskite" is used herein according to its common meaning in the art to refer to the "perovskite crystalline structure" of certain metal halides, as opposed to the Perovskite material ($CaTiO_3$) specifically.

Accordingly, for the purpose of this specification the expression "metal halide perovskite" will be understood to encompass any crystalline material having the same crystal structure as $CaTiO_3$, and general stoichiometry $AMX_3$ (3D-structured perovskite) or $A_2MX_4$ (2D-structured or layered perovskite), in which A is a monovalent cation, M is a divalent Group IVA metal cation, and X is a halide anion. A may be an inorganic cation (such as $Cs^+$ or $Sn^+$) or an organic cation (such as $CH_3NH_3^+$, $C_4H_9NH_3^+$, or $C_6H_5-C_2H_4NH_2^+$), M is a divalent Group IVA metal cation such as $Pb^{2+}$, $Sn^{2+}$, or $Ge^{2+}$, and X may be a halide anion. The halide anion may be an anion of a halide element (e.g. $F^-$, $Cl^-$, $Br^-$, or $I^-$) or a mixed-halide anion, in which case the component $X_3$ or $X_4$ in the formulae above result from the combination of two or more halide elements according to the appropriate ratio (e.g. $Cl_2Br^{3-}$, $Cl_{1.5}Br_{1.5}^{3-}$, $ClBr_2^{3-}$, $Cl_{0.75}Br_{2.25}^{3-}$, $Cl_{0.5}Br_{2.5}^{3-}$, $Br_{2.5}I_{0.5}^{3-}$, $Br_{2.25}I_{0.75}^{3-}$, $Br_2I^{3-}$, $Br_{1.5}I_{1.5}^{3-}$, $BrI_2^{3-}$, or $Br_4^{4-}$).

In some embodiments, the metal halide perovskite is a lead halide perovskite (LHP). In those instances, M is lead (Pb). Lead halide perovskites are particularly attractive due to a number of their potential applications, including in solar cells, photovoltaics, lasers, light emitting diodes (LED), water splitting, and laser cooling. Examples of suitable LHPs for use in the invention include one or more of $CsPbI_3$, $CsPbBr_3$, $CsPbCl_2Br$, $CsPbCl_{1.5}Br_{1.5}$, $MAPbI_3$ (MA=methylammonium), $MAPbBr_3$, $FAPbI_3$ (FA=formamidinium), $(C_4H_9NH_3)_2PbBr_4$, $CsPbCl_2Br$, $CsPbCl_{1.5}Br_{1.5}$, $CsPbClBr_2$, $CsPbCl_{0.75}Br_{2.25}$, $CsPbCl_{0.5}Br_{2.5}$, $CsPbBr_{2.5}I_{0.5}$, $CsPbBr_{2.25}I_{0.75}$, $CsPbBr_2I$, $CsPbBr_{1.5}I_{1.5}$, $CsPbBrI_2$, $CsPbBr_4^{4-}$.

In some embodiments, the metal halide perovskite is a tin halide perovskite. In those instances, M is tin (Sn). Suitable examples of tin halide perovskite include correspondent to those listed herein in relation to lead halide perovskites, in which Pb is substituted with Sn. The use of Sn instead of Pb can have clear advantages in terms of reduced toxicity and easier disposal. Suitable examples of tin halide perovskites for use in the invention include methylammonium tin iodide ($CH_3NH_3SnI_3$, or $MASnI_3$), formamidinium tin triiodide ($CH(NH_2)_2SnI_3$, or $FASnI_3$), and $CH_3NH_3SnIBr_2$ ($MASnIBr_2$).

In some embodiments, the metal halide perovskite is a composite metal halide perovskite, resulting from the combination of metal halide perovskites having different cations A. Examples of suitable such metal halide perovskites include $(MAPbI_3)_{0.95}(FAPbI_3)_{0.05}$.

As a skilled person would know, metal halide perovskites readily undergo polymorphic transitions when heated. As the temperature increases, they transition from photo-inactive and commercially irrelevant crystalline phases (hexagonal or pseudo-hexagonal δ-phases, also referred to as "yellow" phases) to photo-active and commercially relevant phases (i.e. α-, β- and/or γ-phases, also termed "black" phases). However, while "black" phases can be accessed by thermal annealing, they are inherently meta-stable and tend to readily transition to the more thermodynamically stable yellow phases when the material is brought back to room temperature, especially if exposed to moisture.

Due to the stabilizing effect of the amorphous MOF, the metal halide perovskite in the composites of the invention can be stabilized at room temperature in any of its photo-active cubic or pseudo-cubic black phases (i.e. α-, β- and/or γ-phase, when either is available depending on the specific metal halide perovskite).

Accordingly, in some embodiments, the metal halide perovskite comprises one or more of α-, β- and γ-phase metal halide perovskite. For example, the metal halide perovskite may comprise one or more of α-, β-, and γ-phase $CsPbI_3$ perovskite, or a similar crystal phase mixture of $FAPbI_3$ perovskite.

The MOF glass composite of the invention is a combination of solid amorphous MOF and metal halide perovskite. Functionally, interfacial interactions between the amorphous MOF and the metal halide perovskite can effectively stabilizes metastable phases of the perovskite and passivates the perovskite surface defects to preserve it in its optical active state. As a result, the metal halide perovskite in the MOF glass composite is significantly more optically active than it would be in the absence of the amorphous MOF.

From the morphological standpoint, the metal halide perovskite may therefore be provided in any form that is conducive to surface passivation by the amorphous MOF.

For example, the metal halide perovskite may be present in particle form. In those instances, the MOF glass composite can be visualized as a solid distribution of discrete metal halide perovskite particles throughout amorphous MOF acting as dispersion medium. An example of one such dispersion is shown in FIGS. 5(a)-5(c).

Accordingly, the invention may also be said to provide a MOF glass composite comprising a MOF glass matrix having metal halide perovskite particles distributed therein.

Provided surface passivation is achieved, there is no particular limitation to the shape and size of the metal halide perovskite particles.

In some embodiments, the metal halide perovskite is provided as particles having a major dimension from about 2.5 nm to about 1 µm, from about 5 nm to about 750 nm, from about 5 nm to about 500 nm, from about 5 nm to about 250 nm, from about 5 nm to about 150 nm, from about 5 nm to about 100 nm, from about 5 nm to about 50 nm, from about 5 nm to about 25 nm, from about 5 nm to about 10 nm. In some embodiments, the metal halide perovskite is provided as particles having a major dimension from about 2.5 nm to about 50 nm.

In some embodiments, the metal halide perovskite is provided as two-dimensional structures, having a lateral dimension from 200 nm to about 1 µm, with a thickness ranging from 1 nm to 50 nm.

The MOF glass composite may contain metal halide perovskite in an amount that is not particularly limited, provided surface passivation is achieved. For example, the MOF glass composite may comprise metal halide perovskite in an amount of at least about 1%, at least about 5%, at least about 10%, at least about 25%, at least about 50%, at least about 75% by weight, relative to the total weight of the MOF glass composite.

In some embodiments, the MOF glass composite comprises metal halide perovskite in an amount from about 1% to about 75%, from about 5% to about 50%, from about 15% to about 50%, from about 25% to about 50% by weight, relative to the total weight of the MOF glass composite.

In some embodiments, the MOF glass composite comprises metal halide perovskite in an amount of about 25% by weight, relative to the total weight of the MOF glass composite.

The present invention also provides a method of making a MOF glass composite. The MOF glass composite may be a MOF glass composite of the kind described herein.

The method comprises a step of blending MOF and metal halide perovskite to obtain a precursor blend.

There is no limitation on the nature of the MOF for use in this step, provided the MOF (i) can be blended with the metal halide perovskite, and (ii) displays a solid-liquid transition below its decomposition temperature. Accordingly, the MOF may be crystalline MOF or amorphous MOF, provided (i) and (ii) are satisfied.

In some embodiments, the MOF is at least one of amorphous MOF and crystalline MOF. In some embodiments, the MOF is amorphous MOF. A skilled person would be aware of available procedures for the provision of amorphous MOF. For instance, amorphous MOF may be provided through amorphization of crystalline MOF, which can be achieved by the application of high pressure, thermal treatment, or mechanical grinding (e.g. ball-milling) of crystalline frameworks.

In some embodiments, MOF used in the method of the invention is MOF of the kind described herein.

Provided the metal halide perovskite can be blended with the MOF, there is no particular limitation on the nature and morphology of the metal halide perovskite suitable for use in the method of the invention.

In some embodiments, the metal halide perovskite is metal halide perovskite of the kind described herein.

Typically, as-synthesized MOF and metal halide perovskite present at room temperature as granular solids, i.e. as conglomerates of discrete solid particles which size can vary in the nm to mm scale. Accordingly, blending MOF and metal halide perovskite will be understood in the context of solid blending procedures.

MOF and metal halide perovskite may be blended by any means known to the skilled person. For the purpose of the invention, blending may include diffusion blending, convection blending, and shear blending. Accordingly, in some embodiments MOF and metal halide perovskite are provided in particular form, and blended by means of one or more of a tumbler blender, a ribbon blender, a paddle blender, a plow blender, a screw blender, and a drum blender.

In some embodiments, blending is high energy blending. For example, high energy blending may be achieved by ball-milling. Advantageously, ball-milling affords simultaneous grinding and blending, leading to a highly homogeneous precursor blend in which MOF and metal halide perovskite are present as fine particles. A skilled person would be capable to readily identify suitable operational conditions to perform ball-milling of MOF and metal halide perovskite for the purpose of the invention.

The method of the invention also comprises sintering the precursor blend such that the MOF liquefies.

Since the MOF "liquefies", sintering will be understood to involve heating the precursor blend within a temperature range at which the MOF undergoes solid-liquid transition, yet below the decomposition temperature of the MOF. For a given MOF, a skilled person would therefore be capable of identifying a suitable range of available sintering temperatures, for example based on solid-liquid transition temperatures available in the literature for specific MOFs.

Additional considerations may be made by the skilled person when devising an adequate sintering temperature. As explained herein, metal halide perovskites readily undergo polymorphic transitions when heated. As the temperature increases, they transition from photo-inactive and commercially irrelevant phases (hexagonal δ-phases, also referred to as "yellow" phases) to photo-active and commercially relevant phases (i.e. α-, β- and/or γ-phases, also termed "black" phases). Accordingly, for a given metal halide perovskite the sintering temperature could also be tailored to ensure the perovskite converts into any of the optically active α-, β- and/or γ-phases.

In addition, a skilled person may also be mindful that the sintering temperature can affect the crystallite size of the metal halide perovskite. In general, the crystallite size of the metal halide perovskite has been observed to increase with higher sintering temperatures. As the opto-electronic characteristics of metal halide perovskites are also crystallite size-dependent, the sintering temperature can be selected to tune the electronic band gap of the metal halide perovskite. For example, higher sintering temperatures have been observed to induce red-shift of the PL maxima of the metal halide perovskite. For a given metal halide perovskite, a skilled person would be capable to determine specific sintering temperatures aimed at generating specific electronic band gap values.

Considerations made herein in relation to the effects of the sintering temperature on the structure of MOFs and metal halide perovskites can offer guidance to identify suitable combinations of MOF and metal halide perovskites. For example, a target crystalline phase and/or crystallite size of the metal halide perovskite may dictate a range of sintering temperatures. Accordingly, a suitable MOF would be one that displays a solid-liquid transition within a temperature window overlapping that range of sintering temperatures.

In some embodiments, the precursor blend is sintered to a sintering temperature of at least about 100° C. For example, the precursor blend may be sintered to a sintering temperature of at least about 125° C., at least about 150° C., at least about 175° C., at least about 200° C., at least about 225° C., at least about 250° C., at least about 275° C., at least about 300° C., at least about 325° C., at least about 350° C., at least about 375° C., at least about 400° C., at least about 425° C., or at least about 450° C. In some embodiments, the precursor blend is sintered to a sintering temperature of from about 150° C. to about 500° C., for example from about 150° C. and 350° C.

As the MOF liquefies, it coats the metal halide perovskite. This ensures the creation of a continuous MOF-perovskite interface around the metal halide perovskite for effective surface passivation and stabilization. Since the MOF is in liquid form, it can coat the metal halide perovskite to promote extensive and intimate bonding at the interface. As a result, surface passivation of the metal halide perovskite is more effective than what can be achieved by using previously proposed substrates, including crystalline MOFs.

The method of the invention also requires quenching the sintered precursor blend so as to vitrify the liquefied MOF and form the MOF glass composite.

As used herein, the term "quenching" will be understood to mean rapid cooling, at a rate that is sufficient to ensure vitrification of the liquefied MOF. In this context, the term "vitrify" and corresponding terms such as "vitrification" indicate the process by which the liquid-to-solid transition promoted by quenching results in the consolidation of the molecular disorder characteristic of the liquid phase into a solid amorphous glass phase. This will be understood as a process opposite to one in which the liquid-to-solid transition promoted by cooling results in crystallization.

A skilled person would be capable to readily determine a minimum quenching rate effective to consolidate liquid MOF into solid amorphous MOF. Provided quenching promotes vitrification of the liquid MOF, the quenching rate is therefore not particularly limited.

The quench rate may nevertheless be tailored to maximise surface passivation of the metal halide perovskite. In that regard, higher quenching rates have been observed to correlate to lower density of electronic trap states in the metal halide perovskite. The correlation can be used, for example, to tailor the photoluminescence characteristics of the metal halide perovskite. In that regard, higher quenching rates would result in higher quantum yield and higher exciton lifetime of the metal halide perovskite.

For example, in the method of the invention the sintered precursor blend may be quenched at a quenching rate of at least 20° C./minute.

In some embodiments, the sintered precursor blend may be quenched at a quenching rate of at least about 50° C./minute, at least about 100° C./minute, at least about 250° C./minute, at least about 500° C./minute, or at least about 1,000° C./minute.

Provided quenching achieves vitrification of the liquid MOF, there is also no particular limitation as to how quenching is performed. For example, quenching may be cryogenic quenching. As a skilled person would know, cryogenic quenching involves the immersion of the sintered precursor blend into a liquid bath of a cryogenic liquid, such as liquid argon, helium, or nitrogen. Cryogenic quenching has proven particularly effective to achieve minimal density of electronic trap states in the metal halide perovskite.

The provision of MOF glass composites in accordance to the present invention hits the sweet spot between two relevant families of functional materials, MOFs and metal halide perovskites, and addresses several key obstacles in the practical application and development of metal halide perovskites. The MOF glass composites disclosed herein combine the robustness of inorganic matrices and the processability of polymeric substrates, and their reactivity in the liquid phase can readily passivate surface defects of metal halide perovskite.

Of practical note, the MOF glass composites of the invention can display bright excitonic emissions with a wide colour gamut, and display remarkable chemical, morphological, and mechanical stability when exposed to aggressive external conditions. For example, MOF glass composites of the invention can remarkably display stable photoluminescence in water for over 10,000 h.

When the metal halide perovskite is provided in the form of poly-disperse particles, the MOF glass composite displays improved total light scattering and out-coupling efficiency, which is useful for applications such as down-converting layers in liquid-crystal displays.

In addition, the proposed mechano-chemical method of producing the MOF glass composite is inherently simple and flexible. The method also affords preparation of the MOF glass composites from stoichiometric, inexpensive and moderately pure precursors with the consumption of a minimal amount of solvent. As a result, the proposed method is readily scalable for mass-production.

Specific embodiments and aspects of the present invention will now be described with reference to the following non-limiting Examples.

EXAMPLES

Example 1—Synthesis of ZIF and Perovskites as Precursors for Glass

All chemicals were purchased from Sigma Aldrich and used without further purification unless otherwise stated. Cesium chloride (CsCl, 99.9%), cesium bromide (CsBr, 99.9%), cesium iodine (CsI, 99.9%), Lead(II) chloride ($PbCl_2$, 99.999%), lead(II) bromide ($PbBr_2$, 99.999%) and lead(II) iodine ($PbI_2$, 99%) were used for inorganic lead halide perovskite fabrication. Formamidinium iodine (FAI, 99% from Greatcell Solar Materials Pty Ltd) was used for hybrid perovskite fabrication. Zinc oxide (ZnO, nanopowder<100 nm), zinc acetate (Zn(OAc)2, 99.99%), cobalt (II) nitrate hexahydrate ($Co(NO_3)_2 \cdot 6H_2O$, 98%), imidazole (Im, >99%) and benzimidazole (bIm, 98%) were used for Zn and Co ZIF synthesis. N, N-Dimethylformamide (DMF, >99.8%), dimethyl sulfoxide (DMSO, >99.7%), diethyl ether (>99.7%), toluene (anhydrous, 99.8%), chloroform (>99.5%) and ethanol (>99.5%) were used as solvents. $AgNO_3$ (>99.0%) was used for silver photodeposition. All gases were provided by Coregas Pty Ltd.

ZIF-62 Crystal Powder

For the fabrication of ZIF-62 [$Zn(Im)_{1.95}(bIm)_{0.05}$], 162.8 mg (2.00 mmol) of ZnO, 265.6 mg (3.90 mmol) of imidazole and 11.8 mg (0.10 mmol) of benzimidazole were added to a ball milling jar. Then 150 μL DMF and 15 mg (0.19 mmol) $NH_4NO_3$ were added, together with 16 g of zirconium oxide balls. Ball milling was performed with a planetary ball milling machine at 600 RPM for 1 h. ZIF crystals with other Im:bIm stoichiometric ratios were fabricated with the corresponding amount of ligands. The fabricated ZIF-62 crystals were briefly rinsed with methanol and dried in an oven at 80° C. for 24 h prior to further use.

Co—ZIF-62 Crystal Powder

Cobalt nitrate hexahydrate (1.15 g, 3.95 mmol) and imidazole (891 mg, 13.09 mmol) were dissolved in 90 mL DMF by stirring for 1 h (2). Then 12 mg (0.10 mmol) benzimidazole was added to the solution and heated to 130° C. for 72 h. The product was allowed to cool to room temperature and the crystals were collected by centrifugation. Three cycles of washing-redispersion cycles in DMF were implemented to remove all unreacted ligands. Then the sample was dried in 150° C. oven overnight. It should be noted the complete desolvation was not pursued, to minimize amorphisation during the subsequent ball milling mixing process.

Inorganic Lead Halide Perovskite $CsPbCl_3$, $CsPbBr_3$, $CsPbI_3$ and mixed ion perovskites were fabricated via a solvent-free mechanochemical process. For example, for $CsPbI_3$ synthesis, a total 400 mg of stoichiometric mixture of CsI (144.17 mg) and $PbI_2$ (255.83 mg) were added to a ball milling jar, together with 16 g of zirconium oxide balls. Ball milling was conducted with a planetary ball milling machine at 600 RPM for 1 h. Then the solid sample was recovered from the jar and stored under ambient conditions before further testing. All other inorganic perovskites were prepared with a similar procedure, with a total amount of 400 mg stoichiometric precursors.

The differential scanning calorimetry (DSC) measurement confirmed the expected reversible 'yellow'/'black' phase transition at ca. 325° C. and 250° C., with an enthalpy change of 23.7 J/g (FIG. 1). The thermogravimetric analysis (TGA) trace for $CsPbI_3$ was featureless until decomposition at ca. 460° C. (not shown).

Hybrid Lead Halide Perovskite $FAPbI_3$ was also fabricated via a mechanochemical process. 108.7 mg FAI and 291.3 $PbI_2$ were mixed in a ball milling jar, to which 200 μL hexane and 12 g zirconium oxide milling balls were added. The mechanochemical reaction was performed under Ar with 800 RPM for 15 min. Then the solid samples were collected and stored under ambient conditions prior to further testing.

Example 2—Fabrication of MOF Glass Composites

Either ZIF-62 crystal or ZIF-62 amorphous glass was used for the ZIF glass composite fabrication. ZIF crystals were used as fabricated, and ZIF glass ($a_g$ZIF-62) was melted in a tube furnace at the respective melting temperature of the ZIF-62 crystals under argon (Ar) protection. For a typical procedure, 50 mg $CsPbI_3$ perovskite was mixed with 150 mg $a_g$ZIF-62 via ball milling, at 600 RPM for 1 h. The resultant mixtures were referred to as $(CsPbI_3)(a_g$ZIF-62)(25/75), where 25 and 75 are mass percentage of each component.

The fabricated mixture was then placed in a tube furnace for thermal treatment with a ramping rate of 20° C./min under flowing Ar protection. Once the sample reached the designated temperature, the whole tube was immediately removed from the furnace and quenched in either cryogenic (liquid nitrogen) under Ar protection unless otherwise stated. The resultant composites were referred to as (Perovskite)X($a_g$Glass)Y, e.g. $(CsPbI_3)_{0.25}(a_g$ZIF-62$)_{0.75}$. Pure perovskite samples were also subjected to the same ball milling and thermal treatment procedures as a benchmark.

To minimize thermal decomposition, $CsPbI_3$ was sintered with ZIF-62 glass powder (denoted as $a_g$ZIF-62) instead of ZIF-62 crystals. A lower temperature would be required to access the inherent ZIF liquid phase for $a_g$ZIF-62 than crystalline ZIF-62. In addition, during liquid phase sintering, mixed powders are commonly observed to form liquid-solid mixture at above the solidus temperature, which is usually significantly lower than the $T_m/T_g$ of either of the constitutive compound.

Ball milling was used to homogenize $CsPbI_3$ with $a_g$ZIF-62 [$Zn(Im)_{1.95}(bIm)_{0.05}$] ($T_m$ of ca. 375.0° C. and $T_g$ of ca. 303.8° C.), and the resultant mixtures are termed as $(CsPbI_3)(a_g$ZIF-62)(X/Y), where X and Y are mass percentages of each component. The mixtures were sintered to different temperatures (up to 350° C.) at 20° C./min and then cryogenically quenched under Ar. The resultant composites were termed as $(CsPbI_3)_X(a_g$ZIF-62$)_Y$.

Example 3—XRD Characterisation

Room temperature powder XRD analysis was collected with a Bruker D8 Advance MKII diffractometer using Cu Kα radiation with divergent (Bragg-Brentano) geometries. The 2θ range was 5 to 50°, with a step size of 0.02° and a step rate of 10 s. The temperature resolved in situ powder XRD was performed with PANalytical X'Pert Pro MPD equipped with Anton Paar XRD900 furnace with nitrogen environment. Cu Kα radiation with divergent (Bragg-Brentano) geometries was utilised. The ramping rate was 20° C./min, with the 2θ range of 5 to 50°, a step size of 0.05° and a step rate of 10 s.

Figure 2:
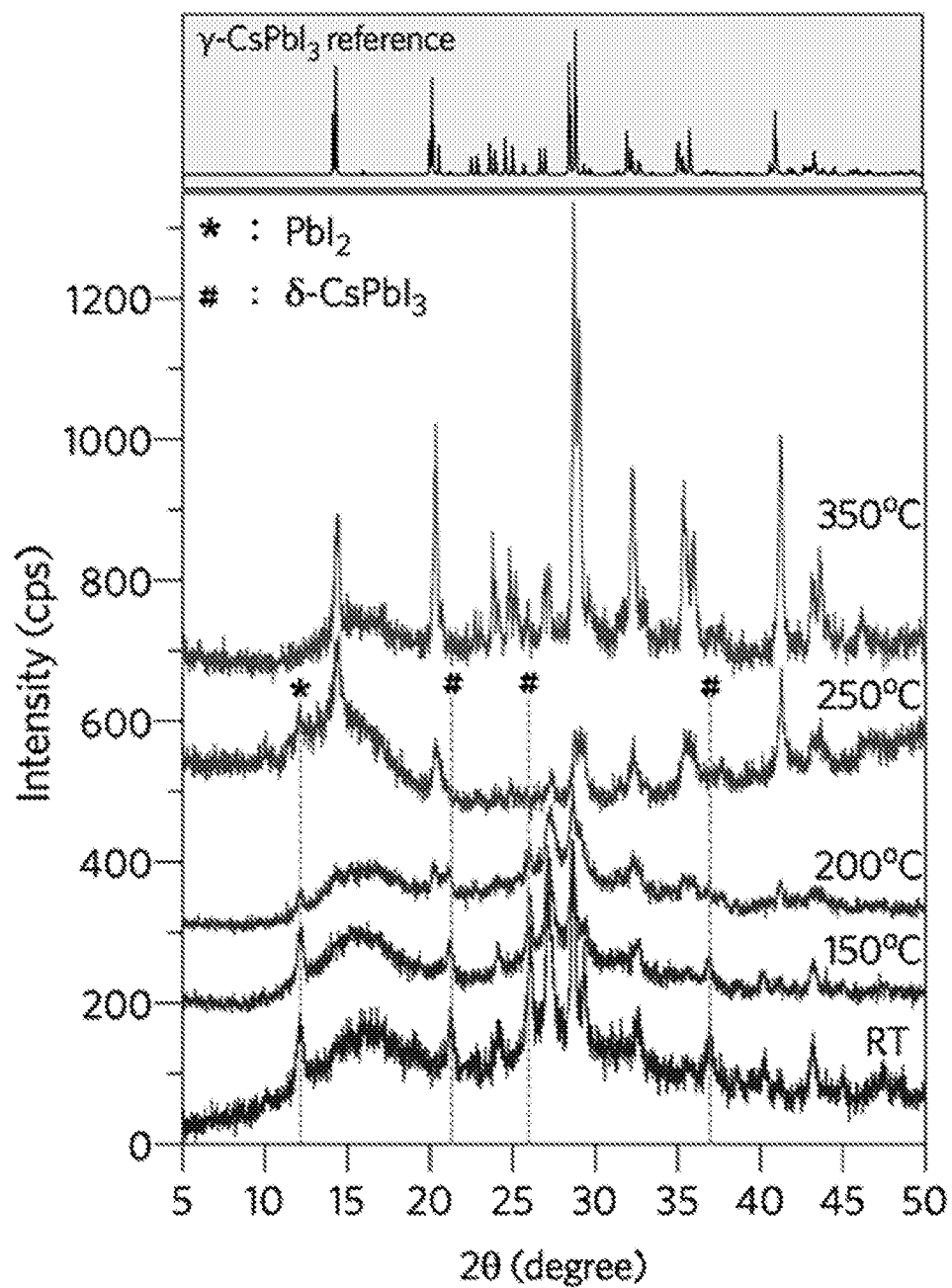
FIG. 2 shows ex-situ powder X-Ray Diffraction (XRD) measured at room temperature on a $(CsPbI_3)_{0.25}(a_gZIF-62)_{0.75}$ composite sintered at increasing sintering temperatures up to 350° C. Some non-overlapping peaks belonging to $PbI_2$ and $\delta$-$CsPbI_3$ are highlighted.

For ex-situ powder X-ray diffraction (XRD), $(CsPbI_3)(a_g$ZIF-62)(25/75) exhibited Bragg peaks from $PbI_2$ and δ-$CsPbI_3$ (FIG. 2). These features gradually diminished for $(CsPbI_3)_{0.25}(a_g$ZIF-62$)_{0.75}$ fabricated with higher temperature sintering. The emerging peaks were assigned to metastable γ-$CsPbI_3$ phases, which was the only identified phase after quenching from 350° C. (FIG. 2). TGA showed negligible weight loss up during sintering (not shown). During sintering process, the entraphic response (20.3 J/g) was more pronounced than the phase transition of 25 wt % $CsPbI_3$, indicating the occurrence of endothermic interaction between two phases. In a second up-scan, a lower $T_g$ of 282.5° C. was identified for $(CsPbI_3)_{0.25}(a_g$ZIF-62$)_{0.75}$ compared with $a_g$ZIF-62.

In-situ synchrotron X-ray scattering data was collected at the (SAXS/WAXS) beamline of the Australian Synchrotron. Detector calibrations were performed using silver behenate standards on the Dectris PILATUS3 X 2M. Scattering intensity normalization was carried out using a diode embedded in the beamstop. Scattering data were collected at a wavelength of 1.12713 Å (11.000 keV) for the q range of 0.002-0.2 Å-1 (detector distance of 7600 mm) and 0.017-1.2 Å-1 (detector distance of 700 mm). The temperature resolved SAXS data was collected with a temperature calibrated Linkam furnace. The ramping rate was ° C./min under flowing nitrogen environment.

Data was reduced to one dimensional using the in-house developed Scatterbrain package. The SAXS data was fitted with the McSAS software package with a minimal Monte Carlo regression.

Example 4—Thermogravimetric and Calorimetric Analysis

Thermogravimetric analysis (TGA) was conducted using a Mettler Toledo 1 STARe system. The sample was placed in an alumina crucible and heated at a ramping rate of 20° C./min under flowing (20 mL/min) nitrogen environment.

A separated Mettler Toledo differential scanning calorimetry (DSC) 1 STARe system was used to determine the calorimetric features. For each measurement, ca. 10 mg sample was loaded into an aluminium crucible and heated under flowing nitrogen (20 mL/min) environment. To determine the melting ($T_m$) and thermal decomposition ($T_d$) and crystal phase transaction temperatures, samples were heated at a ramping rate of 20° C./min to the targeted temperature. To determine the solid-liquid transition temperature ($T_g$), samples were heated above their melting temperature at 20° C./min, and then cooled back to 40° C. at 10° C./min, and then ramped up at a rate of 10° C./min in the second up-scan.

Example 5—Optical Characterisation

Photoluminescence Measurements

Photoluminescence (PL) and time-resolved fluorescence emission spectra were collected at room temperature on an Edinburgh Instrument FLSP-900 fluorescence spectrophotometer. The steady PL spectra were measured with a monochromatized Xe lamp light source, while the time-resolved PL (TRPL) decays were measured with a 375 nm pulsed diode laser excitation source.

Figure 3:
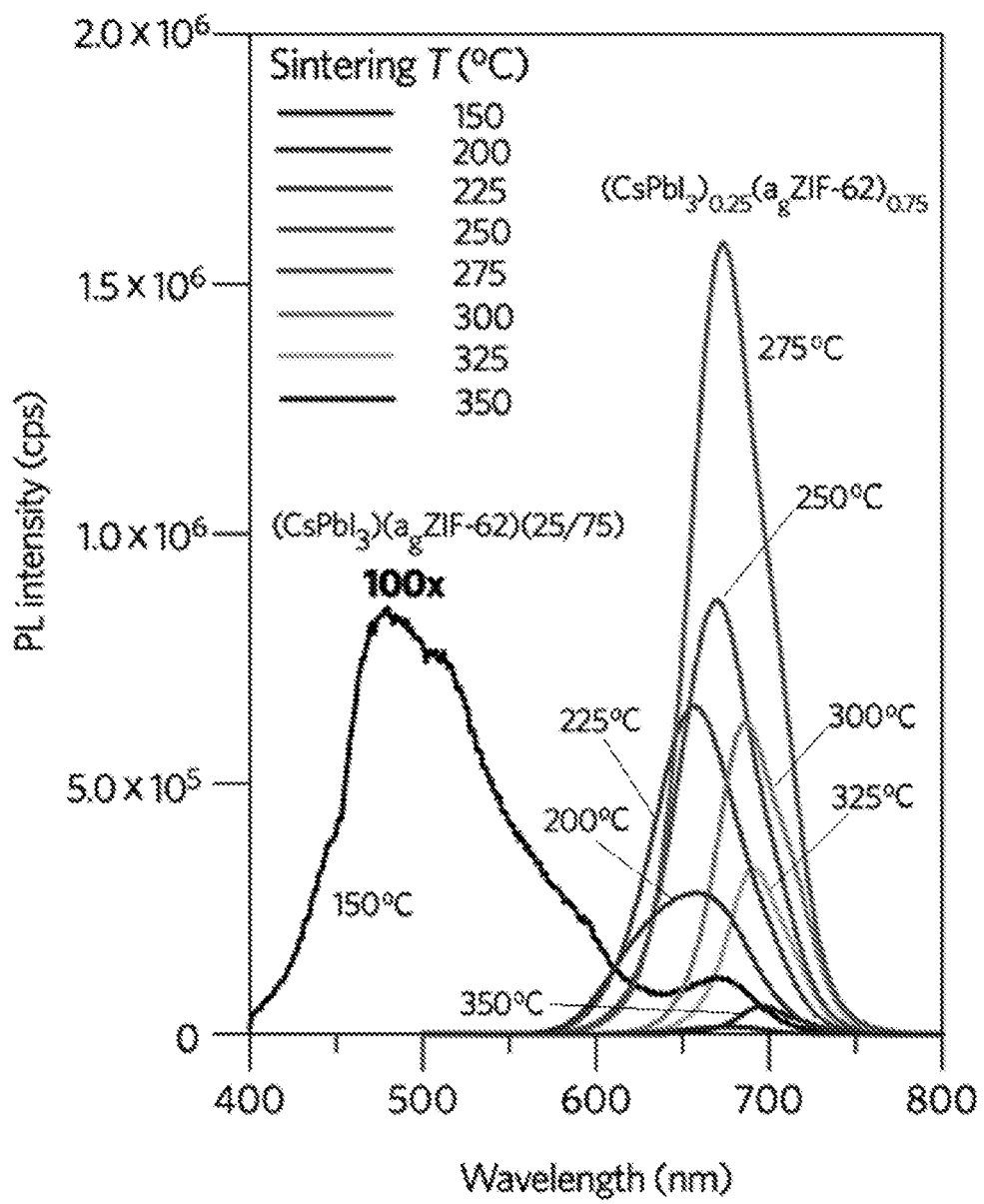
FIG. 3 shows photo-luminescence (PL) emission spectra of $(CsPbI_3)_{0.25}(a_gZIF-62)_{0.75}$ composites sintered at increasing sintering temperature from 150° C. to 350° C., compared to a magnified PL emission spectrum of the corresponding $(CsPbI_3)(a_gZIF-62)(25/75)$ precursor blend, measure before sintering (left peak centred in the 400-600 nm wavelength region)
Figure 4:
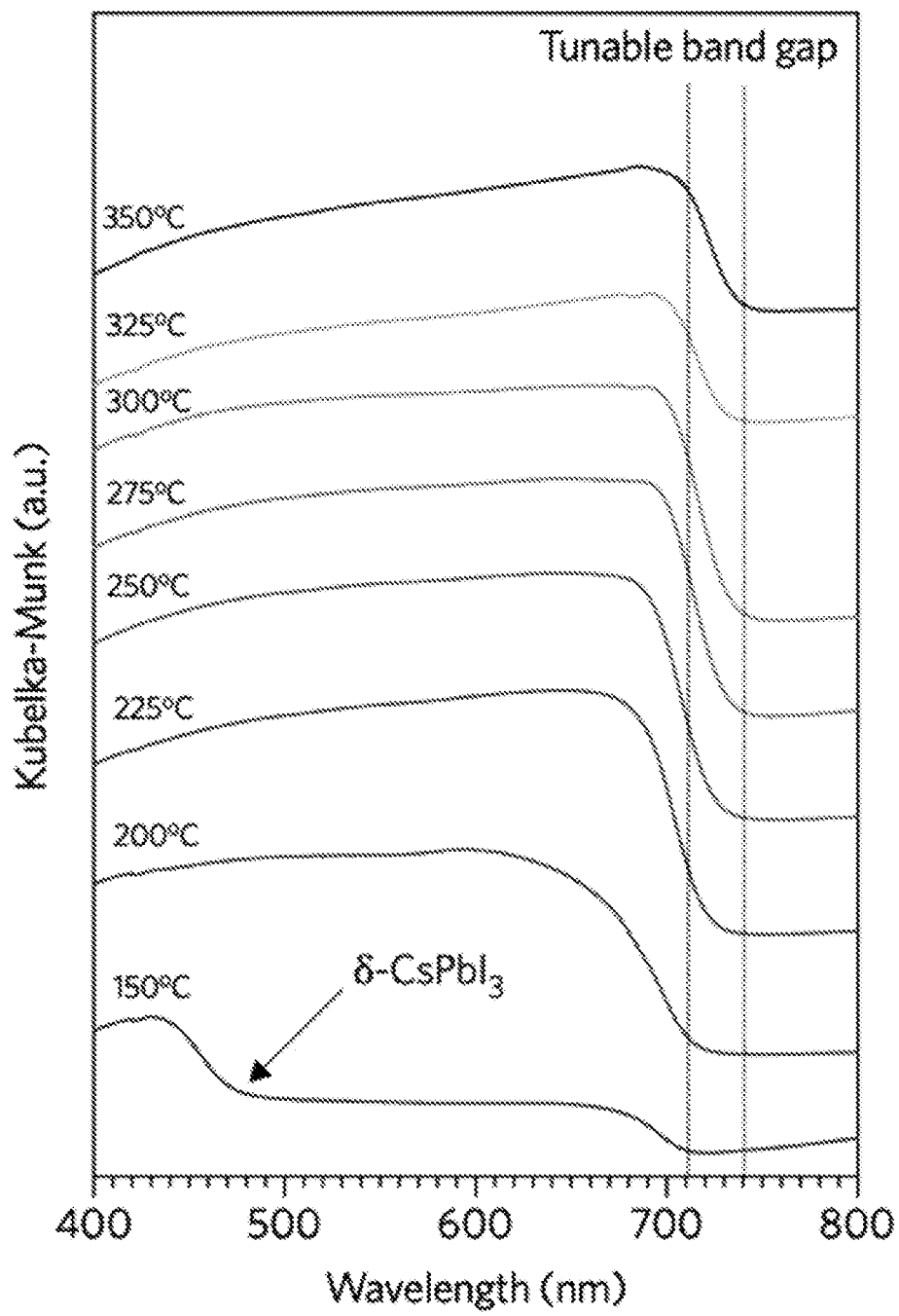
FIG. 4 shows UV-Visible (UV-vis) absorption spectra for $(CsPbI_3)_{0.25}(a_gZIF-62)_{0.75}$ glass composites fabricated at different sintering temperatures from 200° C. to 350° C., relative to the corresponding $(CsPbI_3)(a_gZIF-62)(25/75)$ precursor blend sintered to 150° C.

For optical properties, the broad PL emission from $a_g$ZIF-62 was quenched after mixing with $CsPbI_3$, i.e. ($CsPbI_3$)($a_g$ZIF-62)(25/75), due to photon reabsorption. The composite started to show narrow red PL emission after quenching from 150° C., confirming the preservation of metastable δ-$CsPbI_3$ within $(CsPbI_3)_{0.25}(a_g\text{ZIF-62})_{0.75}$. The strongest PL was obtained with 275° C., showing over 200 times increase over the ($CsPbI_3$)($a_g$ZIF-62)(25/75) (FIG. 3). Higher sintering temperature red-shifted the PL maxima after quenching, aligning with the decreased band gap by the UV-Vis absorption spectra (FIG. 4). The absolute PL quantum yield (QY) of $(CsPbI_3)_{0.25}(a_g\text{ZIF-62})_{0.75}$ can reach over 50%.

Sintering process rendered a lower defect density, shallower trap states and enhanced homogeneity of the γ-$CsPbI_3$, as suggested by the gradually reduced PL full-width at half maximum (FWHM) and longer lifetime of the photo-generated excitons. In addition, this suggests the loss of PL intensity above 275° C. originated from the enhanced interfacial interaction within the composites; it effectively improves the charge separation at the heterojunction and thus suppresses the radiative recombination of excitons.

In a series of parallel tests, $(CsPbI_3)_{0.25}(a_g\text{ZIF-62})_{0.75}$ composites fabricated with a slower quenching (20° C./min) showed a very similar tendency. However, the lower PLQYs and shorter exciton lifetimes suggested an increased amount of trap states formed. Therefore, cryogenic quenching was applied for in this subsequent study.

UV-Vis Absorption

UV-Vis absorption spectroscopy of $a_g$ZIF-62, powder mixture and composites was measured with a Jasco V-650 UV-Vis spectrophotometer.

Example 6—Micro-Phase Structure and Distribution

Scanning Electron Microscopy (SEM)

The surface morphologies and atomic density information near the surface were investigated with a high-resolution scanning electron microscope, JEOL JSM-7100F, under both secondary electron and backscattering mode (8.0 kV acceleration voltage). All samples were dried under 30° C. followed by brief plasma surface cleaning. A surface platinum coating was applied prior to imaging.

Scanning electron microscopy (SEM) in the secondary electron (SE) and backscattering (BSE) modes confirmed the even distribution of heavy atom nanoparticles within the composites. The composites showed continuous surface even quenched from a temperature below solid-liquid transition temperature of $a_g$ZIF-62 (ca. 285° C.), suggesting a large reduction of the liquid formation temperature, a common phenomenon in liquid phase sintering processes.

Transmission Electron Microscopy (TEM)

SED data were acquired using a JEOL ARM300CF fitted with an ultrahigh-resolution pole piece, a cold field emission gun, and aberration correctors in both the probe-forming and image-forming optics (Diamond Light Source, UK). The instrument was operated at 200 kV. A nanobeam configuration was obtained by switching off the aberration corrector in the probe-forming optics and using a 10 μm condenser aperture to obtain a convergence semiangle<1 mrad and a diffraction-limited probe diameter of ca. 5 nm. The probe current was measured using a Faraday cup as ca. 3.5 pA, and the exposure time was 1 ms per probe position. The estimated electron fluence, assuming a disk-like probe, was ca. 10 e-Å-2. A diffraction pattern was acquired at every probe position using a Merlin-Medipix hybrid counting-type direct electron detector (Quantum Detectors, UK), with 512×512 pixels although for these experiments the direct beam was positioned near the centre of a single 256×256 quadrant. Annular dark field STEM images were acquired on a dedicated ADF detector from the same regions following SED acquisition. X-ray energy-dispersive spectroscopy (EDS) maps were also acquired from selected identical regions, following SED acquisition. For EDS mapping, a larger probe current was obtained by using a 150 μm condenser aperture in order to generate sufficient X-ray counts.

SED data were processed using pyxem—0.10.0. The active quadrant was cropped from the full data-set. Calibration of the scan step size and the diffraction pattern pixel size was performed using a 500 nm gold diffraction grating replica with latex spheres (Ted Pella), acquired under identical conditions as the composite samples. SED data were processed using the open source pyXem Python library to find diffraction peaks in every measured diffraction pattern using a difference of Gaussians method, which involves subtracting a blurred version of the diffraction pattern from a less blurred version of the diffraction pattern. EDS data were processed using the open-source HyperSpy Python library to produce maps for each X-ray emission line of interest which were extracted by integrating an energy window. The cross-grating data was also used to determine residual elliptical distortions of the diffraction patterns due to the post-specimen optics.

Electron tomography and point-diffraction experiments were acquired using an FEI Titan3 Themis (Thermo Fisher) fitted with an 'X-FEG' high-brightness electron source and a One View (Gatan) CMOS camera (University of Leeds, UK). The instrument was operated at 300 kV. A nanobeam configuration was obtained with a 50 μm condenser aperture in microprobe mode to obtain an estimated convergence semiangle of ~0.6 mrad. The probe current was measured on the phosphor screen as 7 pA and diffraction patterns were acquired with a 0.5 s exposure. A series of point diffraction patterns were taken by acquiring an ADF STEM image followed by blanking the beam, positioning the beam at a selected point location, and un-blanking, recording, and re-blanking the beam to minimize other beam exposure. An ADF-STEM image was acquired again after point diffraction data acquisition in order to evaluate drift in the sample position for registration of the selected points. A tilt-series was acquired subsequently using the same optical configuration from −70° to +70° in 1° increments.

Point diffraction data were likewise processed using pyxem-0.10.0. Diffraction from a 462.9 nm (2160 lines/mm) gold cross-grating replica was acquired under conditions used for point diffraction, but with an extended camera acquisition while the beam was manually shifted across the sample to record a polycrystalline ring pattern. Calibration of the STEM scan step size and the diffraction pattern pixel size as well as elliptical distortion corrections were performed following routines used for SED, adapted to accommodate the beam stop inserted for point diffraction experiments on the OneView camera. Diffraction patterns were re-binned and characteristic d-spacings were identified to distinguish crystal phases from individual CsPbI3 grains.

All tomography data were pre-processed in the HyperSpy Python library. For ADF-STEM tomography, micrographs were assembled into a tilt-series data-stack and aligned using cross-correlation methods implemented in the Numpy and SciKit-Image Python libraries. The tilt-axis was adjusted for shift and rotation using tools in SciKit-Image Python library. Reconstructions were carried out using total-variation (TV) regularization with the primal-dual hybrid gradient (PDHG) algorithm, implemented in Python using the ASTRA Toolbox for a projector.

STEM-CL experiments were performed on a Nion Hermes200 ('ChromaTEM') electron microscope at the Laboratoire de Physique des Solides (Université Paris-Saclay, Orsay, France) equipped with an electron monochromator and a cold field emission gun electron source. The microscope was operated at an accelerating voltage of 100 kV with a beam convergence semi-angle of approximately 15 mrad. Samples were cooled to approximately 150 K using a liquid nitrogen cooling system for the sample stage. CL signals were collected using an Attolight Mönch 4107 STEM-CL system fitted with an optical spectrometer with a 150-grooves/mm diffraction grating blazed at 500 nm. Hyperspectral images were obtained by recording one full CL spectrum per pixel while scanning the sample. Typical dwell times were 20 ms per pixel. The spectral resolution of the spectrometer CCD was 0.33 nm/pixel.

TEM was applied to further interrogate the microstructure for $(CsPbI_3)_{0.25}(a_gZIF\text{-}62)_{0.75}$ (sintered to 300° C.). The annular dark-field (ADF)-STEM images showed good mass-thickness contrast between two phases, with their distribution well corroborated with the expected elemental distribution based on the energy-dispersive X-ray spectroscopy (STEM-EDS) (FIG. 5(a)). The crystalline and amorphous regions were identified by scanning electron diffraction (SED) mapping, which was obtained by summing the number of Bragg diffraction discs in the electron diffraction pattern recorded from each probe position. The crystalline regions correspond to the distribution of the $CsPbI_3$ phases (FIG. 5(b)).

Further convolutional neural network (CNN) classification of the SED patterns identified the predominant $\gamma\text{-}CsPbI_3$ phase within the composite. Individual grains were mostly single-crystals, despite a small number being ambiguous with speckles in the classification, possibly due to crystal structure distortion at the interfaces or out-of-plane stacking of different grains (FIG. 5(c)). Further study on $(CsPbI_3)_{0.25}(a_gZIF\text{-}62)_{0.75}$ (sintered to 275° C.) revealed similar behavior, with a slightly lower ratio of the $\gamma\text{-}CsPbI_3$ pixels, corroborated well with the ex situ XRD results (FIG. 2).

ADF-STEM tomography was applied to reconstruct a complete large shard of the $(CsPbI_3)_{0.25}(a_gZIF\text{-}62)_{0.75}$ (sintered to 300° C.) to probe the three-dimensional crystal phase distribution. The atomic density of the composite was coded with different colors: yellow for $CsPbI_3$ and purple for $a_gZIF\text{-}62$. Composites fabricated with liquid phase sintering usually contain voids, which can be observed from the cross-sectional structure reconstruction. The subsequent SED data identified the non-perovskite $\delta\text{-}CsPbI_3$ near the voids, and $\gamma\text{-}CsPbI_3$ at the region with denser packing. This points to a correlation between interfacial contact and $CsPbI_3$ phase control.

The cathodoluminescence (CL-STEM) detected strong, narrow luminescence from isolated grains (<40 nm), with minor inter-particle emission wavelength shifts (<4 nm). The variation of CL intensity can be attributed to the depth of the $CsPbI_3$ from the composite surface (FIGS. 6(a) and 6(b)). It should be noted that though large particles were observed in STEM, the average size of the $CsPbI_3$ was ca. 30 nm, which can be readily further reduced by extended ball milling before sintering.

SED Phase Identification

A convolutional neural network for X-ray diffraction classification was adapted from Bennett et al. "Melt-Quenched Glasses of Metal-Organic Frameworks", *Journal of the American Chemical Society* 138, 3484-3492 (2016). This network structure was shown to be robust to peak drop-out and changes in peak intensity [A], properties that are intrinsic to SED data where diffraction is recorded from single orientations at each pixel. The neural network was then implemented in TensorFlow (2.1.0) with Keras for the binary classification problem required to distinguish $\gamma\text{-}CsPbI_3$ and $\delta\text{-}CsPbI_3$ in SED data. Simulated two-dimensional spot patterns were generated and then converted to one-dimensional patterns by azimuthal integration in pyxem 0.11.0 (17) for training and testing the neural network. Training data were generated by uniformly sampling over crystal orientations, excluding rotation about the azimuthal integration axis. Testing data were generated by random sampling orientations, emulating the unknown and likely random orientations found in the experimental composite. Random sampling of orientations for training data yielded comparable results. To ensure consistent intensity ranges between training, testing, and experimental data, all data were normalized per pattern by setting the maximum intensity to one. Experimental patterns were cropped to exclude the direct beam and background subtracted to remove diffuse scattering intensity by fitting a power law of the type $A*k^{-b}$ where k is the scattering vector magnitude (Å-1) and A and b are fitting parameters. The fitting was carried out using the diffuse intensity tail at low and high scattering angles outside of the window of scattering vectors showing Bragg diffraction spots, and the A parameter was constrained to non-negative values. To match the reciprocal space calibrations between simulated patterns and experimental data, the calibration was first determined by fitting a ring pattern from polycrystalline gold acquired under the same experimental conditions followed by additional refinement of the calibration using image registration (Matlab, MathWorks) of simulated patterns with near zones axis patterns of $\gamma\text{-}CsPbI_3$ and $\delta\text{-}CsPbI_3$ identified after an initial neural network classification of the experimental dataset. The direct beam was not included in simulated spot patterns, and the one-dimensional patterns were cropped to the same range of k as for experimental data.

The neural network structure was optimized for electron diffraction data by evaluating the effect on performance of the number of training data, hidden layer depth, filter size, kernel size, strides, activation function, optimizer and the number of epochs used in network training. The performance of the network was assessed as the classification accuracy using simulated testing data, and parameters were varied until plateaus in the network performance were observed. The optimised approach (network accuracy>98% for 1000 patterns as testing data) used 1000 simulated patterns for training data (500 for each crystal phase), four one-dimensional convolutional layers, a filter size of 32 for each of the four convolutional layers with both the kernel size and strides set at (8,5,3,3), the Adam optimizer, and 100 epochs for training. For experimental application, the pixels containing Bragg scattering were isolated by applying a threshold to the crystallinity maps. The patterns were then classified, and a phase map was generated at the original pixel positions using the probabilistic predictions (0-1) determined by the neural network. For visualisation purposes, the pixels excluded from the crystal classification were set to a distinct intensity and colour value, i.e. pixels assigned to vacuum, carbon film, or $a_g$ZIF-62 due to the absence of Bragg scattering recorded at those positions.

The neural network classification was validated by summing the normalised patterns from all pixels within each class. The resulting averaged patterns corresponded to expected differences (unique scattering vectors) between the γ-CsPbI$_3$ and δ-CsPbI$_3$ phases. Additional inspection of experimental patterns near high symmetry zone axes that could be manually indexed with high confidence further corroborated the classification results. Some speckle was observed in the crystal phase maps, and examination of these regions indicated these corresponded to crystal orientations with few Bragg scattering spots resulting in an inherently ambiguous classification. Manual inspection of the SED data pixel-by-pixel indicated all crystals exhibited single crystal diffraction patterns with no significant changes in orientation or phase across individual grains.

Example 7—Structure Evolution During Sintering

Figure 5:
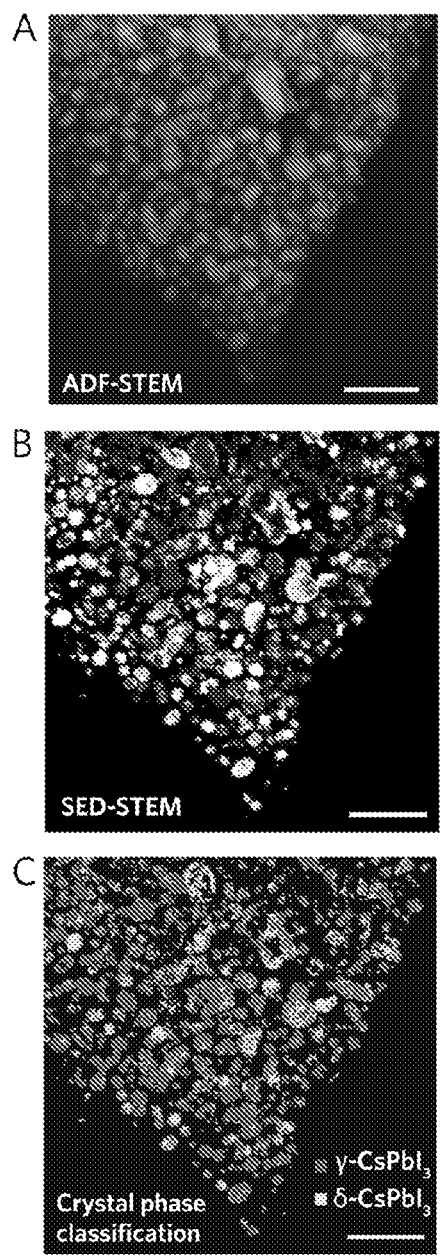
FIG. 5 shows phase distribution of $\gamma$- and $\delta$-crystalline phases of $CsPbI_3$ for a $(CsPbI_3)_{0.25}(a_gZIF-62)_{0.75}$ sample glass composite as detected by (A) Annular Dark-Field-scanning transmission electron microscope (ADF-STEM) and (B) scanning electron diffraction-scanning transmission electron microscope (SED-STEM) mapping, (C) visualised in the corresponding $CsPbI_3$ crystal phase classification.
Figure 6:
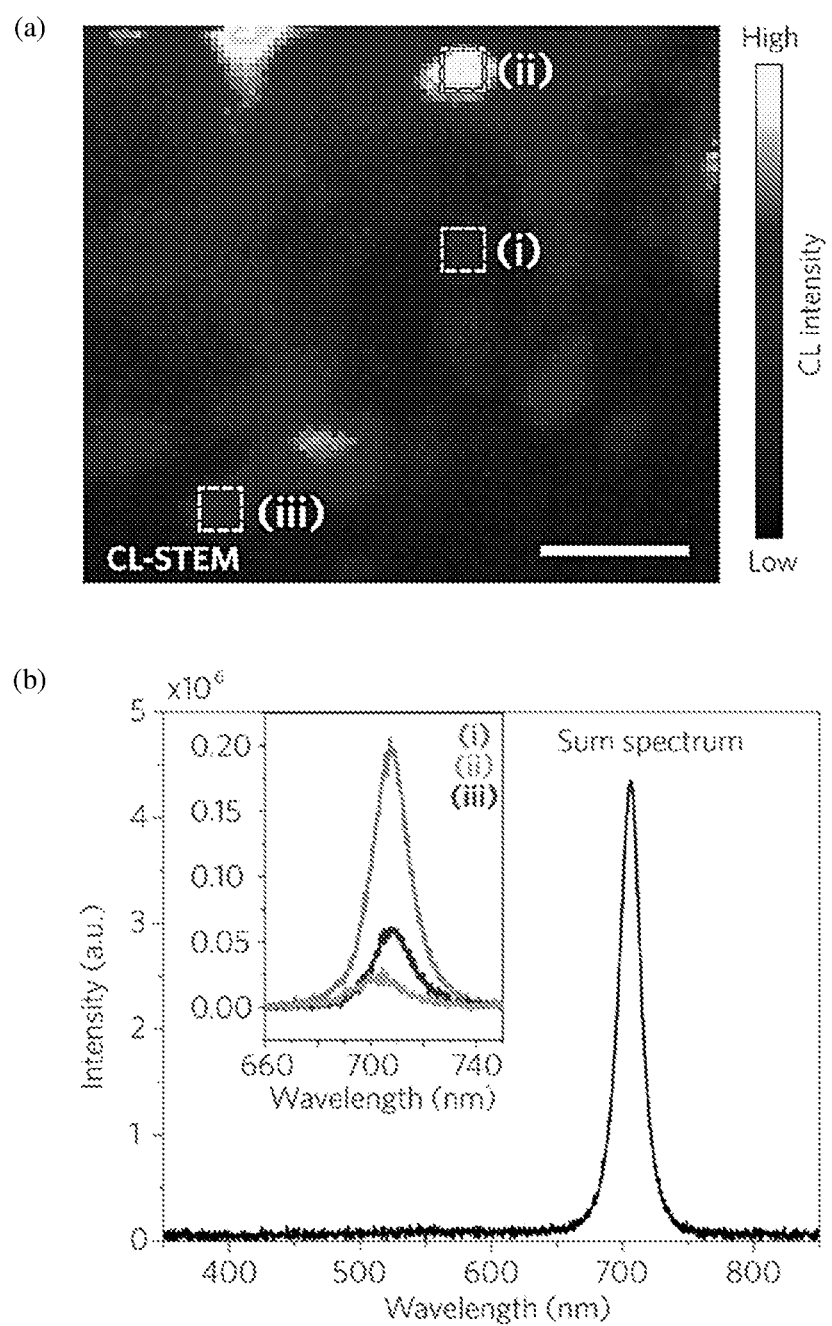
FIG. 6 shows (E) cathodoluminescence-scanning transmission electron microscope (CL-STEM) mapping of the Integrated CL intensity (scale bar is 70 nm), (F) CL spectra acquired at each STEM probe position, and the sum CL spectrum of the whole region in (E)
Figure 7:
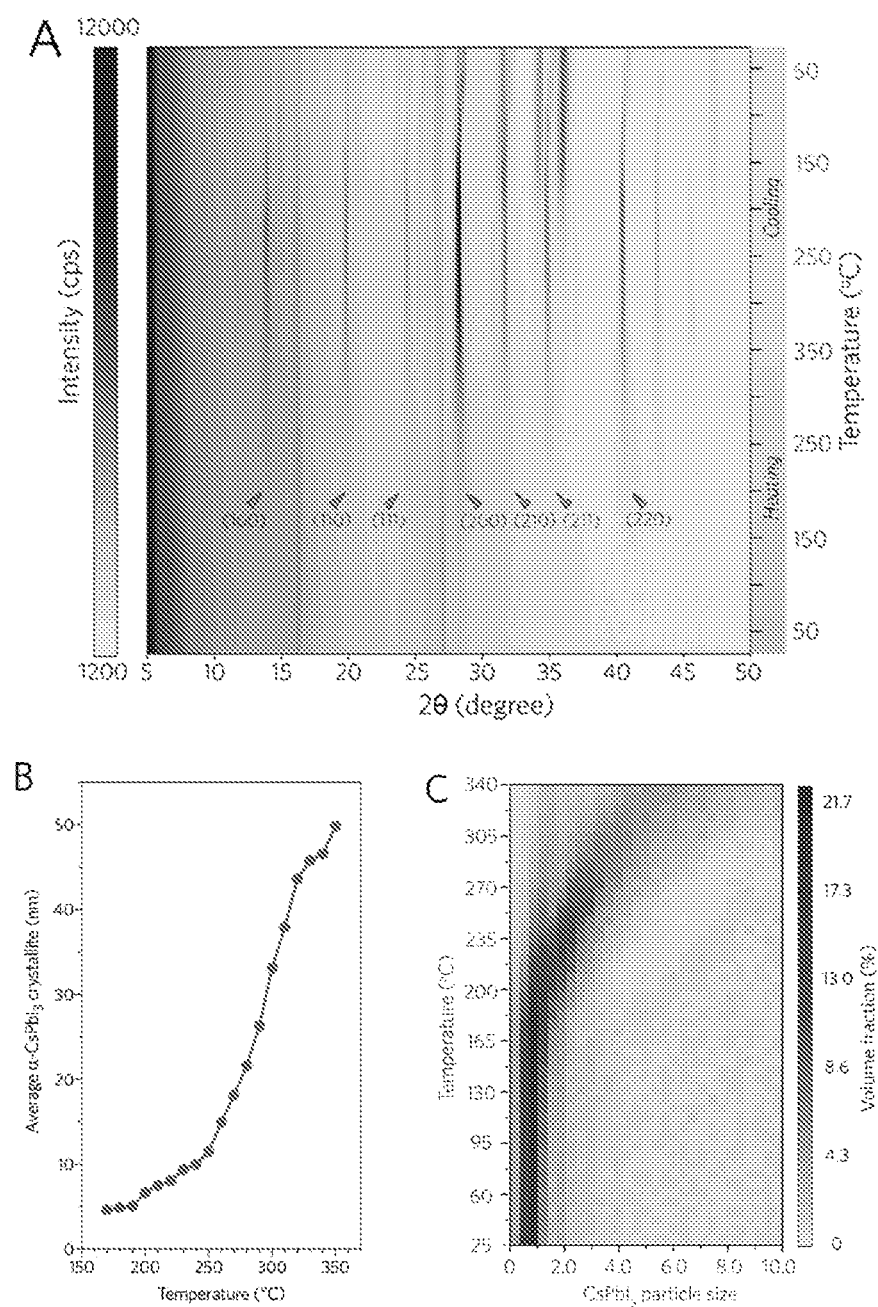
FIG. 7 shows the microstructural evolution of an embodiment MOF glass composite during sintering followed by quenching, in particular (A) temperature-resolved in situ powder XRD measured for $(CsPbI_3)(a_gZIF-62)(25/75)$ precursor blend undergoing sintering up to 350° C. followed by quenching, with marked Bragg peaks hkl for $\alpha$-$CsPbI_3$ (Pm-3m) for reference, (B) evolution of the corresponding average size of $\alpha$-$CsPbI_3$ crystals calculated from the powder XRD.

Temperature-resolved in situ powder X-ray diffraction (XRD) was collected for the (CsPbI$_3$)($a_g$ZIF-62)(25/75) (FIG. 7(a)). The emerging peaks from ca. 150° C. indicated the formation of α-CsPbI$_3$ (Pm-3m), and the peaks intensified with higher sintering temperatures. The calculated α-CsPbI$_3$ crystallite size increased with higher sintering temperature (FIG. 7(b)), showing good agreement with the STEM results (FIGS. 5 and 6). During the quenching stage (FIG. 7(a)), the gradual disappearance of the diffraction peak at ca. 35° (d=2.6 Å) from ca. 200° C. suggested the tilting of [PbI$_6$]$^{4-}$ octahedra and the formation of γ-CsPbI$_3$ (Pbnm).

Similar temperature-dependent crystal structure evolution was observed through in situ synchrotron small-angle X-ray scattering (SAXS) measurements (0.5-1.2 Å$^{-1}$). In particular, SAXS (0.002-0.5 Å$^{-1}$) revealed the gradual coarsening starting from ca. 160° C. for small CsPbI$_3$ (<10 nm), which was the main scattering phase within the composite (FIG. 7(c)). In comparison, pure $a_g$ZIF-62 or CsPbI$_3$ had negligible coarsening before 300° C. Additionally, the rapid composite densification was observed above 175° C., possibly due to the presence of a liquid-solid mixture above the solidus temperature during liquid phase sintering.

A cascade of CsPbI$_3$ crystal structure transition and grain coarsening occurred during the composite sintering. The viscous liquid-solid mixture above the solidus temperature increased the surface energy of δ-CsPbI$_3$, favoring the phase transition to α-phase in a similar manner to the case of solvent modulated or ligand-capped CsPbI$_3$ quantum dots. Smaller grains, for which the contribution of interfacial energy was more dominating, experienced phase transition at a lower temperature. Bulkier grains required a higher temperature to reduce the phase transition energy barrier and to achieve intimate interfacial contacts with viscosity liquid. The presence of the liquid phase also enables CsPbI$_3$ grain diffusion and agglomeration, but mostly for small particles due to the high diffusion resistance.

The composite, therefore, showed sintering temperature-dependent α-phase crystallite size profile and subsequent tunable band gap after quenching, due to quantum confinement effect. We anticipated a intimate interfacial contact was critical for the phase control: with [Zn(Im)$_{1.55}$(bIm)$_{0.45}$] $a_g$ZIF-62, a substantial amount of δ-CsPbI$_3$ and PbI$_2$ remained within the final composite possibly due to higher inherent T$_g$ (ca. 309.3° C.) and viscosity from bulkier bIm ligands.

Example 8—Dynamic Properties and Interfacial Bonding

Synchrotron Tera-Hz Far-Infrared (THz/Far-IR) Absorption Spectroscopy

THz/Far-IR absorption spectra were collected at the THz/Far-IR beamline at the Australian Synchrotron with a Bruker IFS 125/HR Fourier Transform (FT) spectrometer. The bolometer was kept under cryogenic condition with liquid helium to improve the signal-to-noise ratio, and a 6 μm thick Multilayer Mylar beamsplitter was used.

For the measurement, attenuated total reflection (ATR) was applied. Samples were mounted on the surface of the diamond crystal window and held in position by applied pressure.

Temperature resolved in situ spectra were collected with the ATR heating stage and the sample was kept under flowing Ar (ca. 20 mL/min). For data processing, the Extended ATR correction algorithms in the OPUS 8.0 software, together with NumPy module v1.15 together with Python v3.5, were applied for spectral data correction and peak fitting.

Computational Calculation of the Vibration Behaviours

Standard computational chemistry calculations were carried out using Gaussian 16. We use molecular species to model the key component of interest of the materials system. They include, as in our previous study, a complex of Zn with three imidazole anions and one benzimidazole anion derivatives; in addition, we have also examined analogous complexes of Zn with three imidazole anions and one iodide. These complexes all have an overall charge of minus two, and they correspond to Zn(II) species. Geometries of these molecular models were optimized with the B3-LYP method in conjunction with the 6–31+G(d,p) basis set for all elements except iodine, for which the def2-SVP basis set was used. Harmonic vibrational frequencies were obtained at the same level of theory. Simulated infrared spectra were obtained by assuming a Gaussian band for each peak with a half-width of 10 cm$^{-1}$. For the iodide complex, multiple conformations were sampled, and the reported spectrum corresponds to an average of the spectra for these conformers.

X-Ray Photoelectron Spectroscopy

The sample surface chemistry was probed with Kratos Axis Ultra XPS with mono Al Kα (1486.6 eV) at 150 W (15 kV, 10 mA). The instrument was equipped with a 165 mm hemispherical electron energy analyser. The C1s peak position was set to 284.8 eV and used as an internal standard.

Raman Spectroscopy

Raman spectra were measured with Renishaw Raman microscope and spectrometer. All samples were excited with 785 nm laser beam. Five cycles of data collection were implemented to reduce the effect of background noise caused by strong fluorescence.

Solid-State NMR

Solid-state NMR experiments were performed on a 600 MHz Varian NMR system using a 1.6 mm HXY FastMAS probe and a 3.2 mm HX CPMAS probe. The 3.2 mm probe was used for measuring $Zn[(Im)_{1.95}(bIm)_{0.05}]$ series of the samples. The sample spinning frequency was 20 kHz unless otherwise stated. 133Cs MAS NMR spectra were measured with a short excitation pulse of 1 μs; the number of scans was 1000-1500 and the repetition delay was 60 s. The 207Pb MAS NMR spectra were recorded with the Hahn echo pulse sequence; an inter-pulse delay of one rotation period was used and the repetition delay was 1 s.

With the 1.6 mm probe the spinning frequency was 32 kHz, the π/2 pulse length was 2.2 μs and the number of scans was 226,000. With the 3.2 mm probe the spinning frequency was 20 kHz, the π/2 pulse length was 2.9 μs and the number of scans was 100,000. The 1H-13C cross-polarization (CP) MAS experiments consisted of excitation of protons with a π/2 pulse of 2.6 μs, CP block of 4 ms, and signal acquisition with high-power XiX proton decoupling. A total of ca. 10,000 to 50,000 scans were accumulated with the repetition delay of 1 s. In the 1H-15N CP MAS experiment, the length of the CP block was 3 ms, the repetition delay was 0.5 s, and the number of scans was 450,000. Larmor frequencies for 13C, 15N, 133Cs, and 207Pb were 150.72 MHz, 60.76 MHz, 78.62 MHz, and 125.40 MHz, respectively. The corresponding spectral axes were referenced relative to the signals of tetramethylsilane, nitromethane, cesium nitrate, and tetramethyllead, respectively.

Discussion of Results

Figure 8:
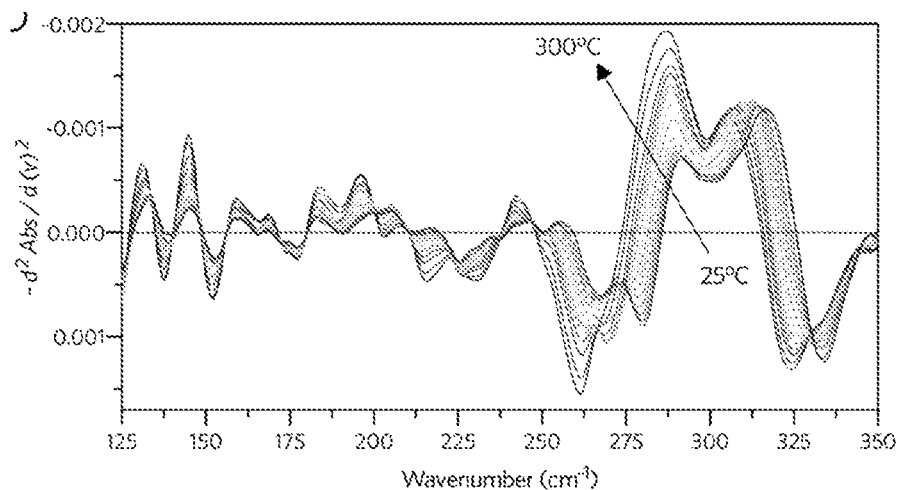
FIG. 8 shows (D) Temperature-resolved $2^{nd}$ derivative in situ THz-FIR spectra for the powder mixture during the first heating ramp from 25 to 300° C. (at 20° C./min) under argon, (E) $^{133}$Cs MAS NMR spectra of (CsPbI$_3$)(a$_g$ZIF-62) (25/75) powder mixtures and (CsPbI$_3$)$_{0.25}$(a$_g$ZIF-62)$_{0.75}$ (in the plot, symbols * denote spinning sidebands and † denote the weak signal of CsI)
Figure 8:
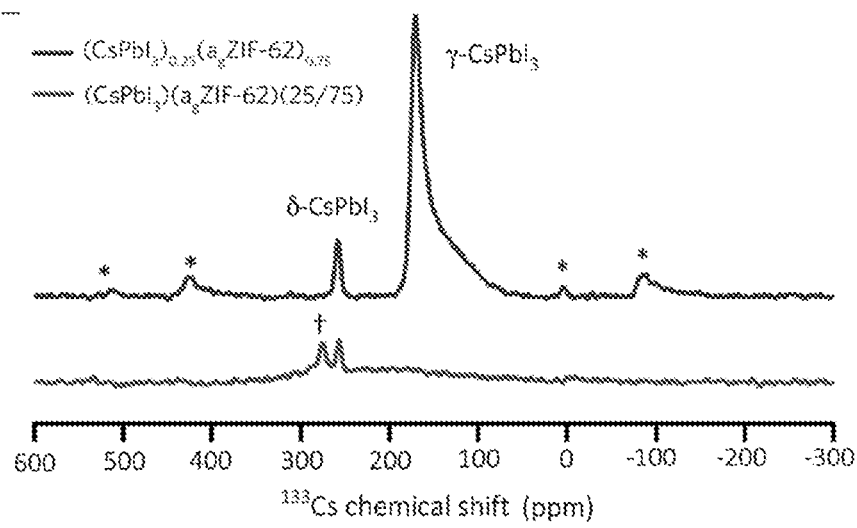

Molecular Lewis acids/bases and imidazolium ionic compounds can enhance LHP phase stability and passivate surface defects by forming surface bondings. Therefore a series of studies were performed to understand the interfacial interactions within $(CsPbI_3)_{0.25}(a_gZIF-62)_{0.75}$. Temperature-resolved synchrotron tera-Hz (THz) FarIR vibrational spectroscopy offered a direct probe of the ZIF dynamic properties and $CsPbI_3$ phonon modes. For ZIF within $(CsPbI_3)_{0.25}(a_gZIF-62)_{0.75}$, the $2^{nd}$-derivative spectra revealed the fine vibrational modes of the Zn tetrahedron (FIG. 8(a)).

The mode at ca. 290 cm$^{-1}$, assigned to the Zn—N vibrations in $Zn(Im)_2(bIm)I$ tetrahedra by density functional theory (DFT), began to intensify with higher temperature from 150° C. (dot-line). The emerging peak at ca. 135 cm$^{-1}$ also aligned the Zn—I stretching vibration in DFT. In addition, these emerging features remained largely invariant during cooling and a $2^{nd}$ heating cycle, suggesting the formation of interfacial bonding between $CsPbI_3$ and liquid ZIF beyond the solidus temperature (ca. 150° C.).

The interfacial bonding also started to disrupt the inherent phonon modes of $CsPbI_3$ (Pb—I—Pb bending and Pb—I stretching) from ca. 150° C. during sintering, while such phonon modes of pure $CsPbI_3$ can be preserved even after sintered to 300° C. The possible formation interfacial bonding by sintering was also identified by ex situ X-ray photoelectron spectroscopy (XPS) and Raman spectroscopy, showing the peak shifts for all elements (Cs, Pb, I, Zn and N in XPS) and peak broadening for imidazolate vibration (ca. 1170 cm$^{-1}$ in Raman).

Being isotope specific, NMR spectroscopy offers a selective insight into the different species comprising the powder mixture and the composite. The $^{13}$C and $^{15}$N NMR spectra of the composite exhibited broader signals than the corresponding spectra of the powder mixture, indicating additional disorder of the ZIF glass.

Sintering conditions and solid-liquid transition temperature of $a_g$ZIF-62 imposed a minor effect on the composite $^{207}$Pb NMR spectra, the $^{133}$Cs MAS NMR spectra were however highly dependent on these conditions. The spectra of the powder mixtures both exhibit narrow signals of δ-CsPbI$_3$ (260 ppm), CsI (290 ppm) and low broad signals extending between 0 and ca. 350 ppm, belonging to poorly crystalline, highly defective CsPbI$_3$. In terms of the composites, the broad contributions and CsI peaks diminished, and the major signals stem from γ-CsPbI$_3$. The different ratios of δ-/γ-phases between two composite samples aligned the above-mentioned effects of sintering temperature and the bIm content of $a_g$ZIF-62. The γ-CsPbI$_3$ peaks in composites exhibited a notable shoulder between 160 ppm and 80 ppm, suggesting a significant distribution of chemical environments within γ-CsPbI$_3$ particles of the composite, which might be related to a large effect from the interface can propagate towards the interior of the γ-CsPbI$_3$ grains.

The X-ray total scattering patterns examined for $a_g$ZIF-62, $(CsPbI_3)(a_g$ZIF-62)(25/75), and $(CsPbI_3)_{0.25}(a_g$ZIF-62)$_{0.75}$ samples. The relatively weak Bragg diffraction peaks for the powder mixture intensified after the formation of the composite. The X-ray PDFs, D(r), were extracted after data correction and inverse Fourier transformation of the structure factor S(Q). The short- to long-range oscillations of the $a_g$ZIF-62 and simulated γ-CsPbI$_3$ were well preserved in the composite. It suggested the preservation of the inherent structure in the bulk phase within the composite, and the change of the chemical environment mainly occurred at the interfacial regions.

The pseudo-cubic phases of CsPbI$_3$ have double-well phonon modes at the center of the Brillouin zone, driving the phase transition to δ-CsPbI$_3$ in a concerted phonon manner. The interfacial bondings disrupt the local Pb—I sublattice phonon modes and vibrational harmonicity and therefore avoids the harmonic order-disorder entropy. In addition, CsPbI$_3$ has a low crystal lattice energy due to low ionic charges and large interatomic distances, but much higher energies can be expected from the interfacial bondings. Together with the physical confinement effect offered by the matrices, these aspects prevents a complete restructuring of the atomic coordination. Therefore countered the strong driving force of the γ- to δ-phase transition, and maintain the metastable γ-CsPbI$_3$ within the composites.

Although LHPs have a high tolerance to structural defects, significant concentrations of Schottky-type Cs-site and halide vacancies can be anticipated due to their low formation energies, which can lead to non-radiative exciton recombination. Sintering can effectively reduce the bulk crystal defects as suggested by the enhanced crystallinity. The interfacial interactions can further passivate undercoordinated Pb/halide sites and negatively charged Pb-halide antisites at the surface of the CsPbI$_3$.

The ZIF-62 liquid features both Lewis base ligands (imidazolate and benzimidazolate with p-conjugation) and Lewis acid sites (undercoordinated Zn nodes), to passivate both Lewis acid and base defects in CsPbI$_3$. In addition, the Zn—I interactions may mitigate the interstitial defect caused by halide p-p antibonding states; the lower s-orbital level of Zn can lead to shallower defects and promote the hole de-trapping rate following Shockley-Read-Hall statistics.

Example 9—ZIF Glass Composites

The versatility of the liquid phase sintering was examined with CsPbX$_3$ (X═Cl, Br and mixed halide ions).

Figure 9:
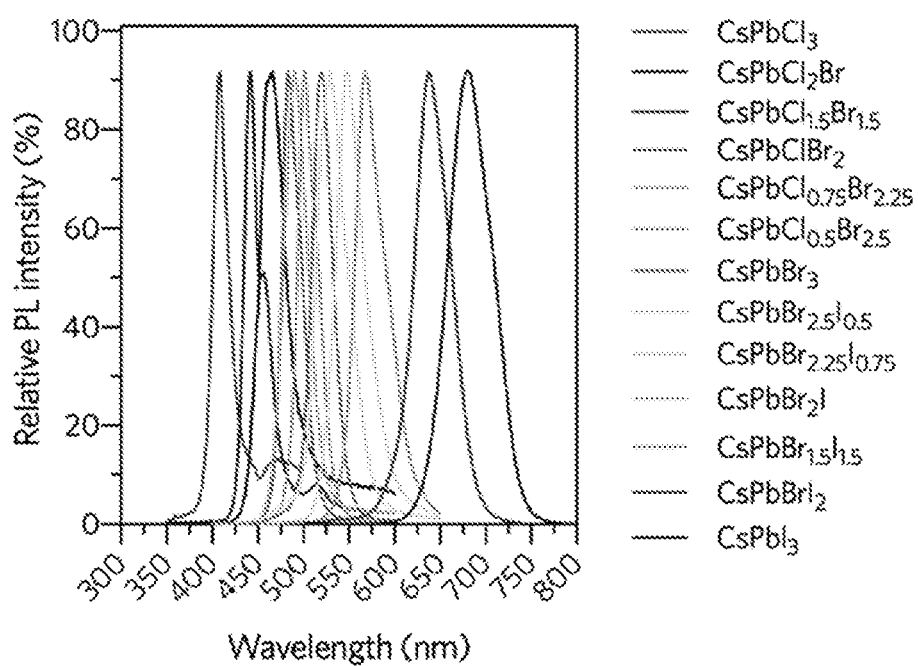
FIG. 9 shows normalized photo luminescence (PL) emission spectra of (CsPbX$_3$)$_{0.25}$(a$_g$ZIF-62)$_{0.75}$ glass composites, with X being different halides or mixed halides, top to bottom in the inset list corresponding to the left to right emission spectra, FIG. 10 (C) PL peak intensity of (CsPbI$_3$)$_{0.25}$(a$_g$ZIF-62)$_{0.75}$ glass composite after about 20 hour sonication in different types of solvents relative to the PL intensity of the MOF glass composite before exposure to the solvents, and (D) time evolution of the PL intensity of (CsPbI$_3$)$_{0.25}$(a$_g$ZIF-62)$_{0.75}$ glass composite soaked in Milli-Q water relative to the PL intensity of the glass composite before being soaked in Milli-Q water.

The composites showed a wide color gamut with narrow PL peaks (FWHM: 20.4-45.1 nm, FIG. 9). The presence of shoulder peaks for the CsPbCl$_3$, CsPbCl$_2$Br and CsPbCl$_{1.5}$Br$_{1.5}$ composites can be attributed to the emission from a$_g$ZIF-62. For all CsPbX$_3$ composites with 25 wt % loading, their absolute PL intensities were at least two orders of magnitude higher than the corresponding pure CsPbX$_3$ samples, either as-synthesised or after being treated with identical ball milling and sintering to 275° C. The broad, asymmetric PL peak for the pure CsPbX$_3$ points to halide-ion segregation, which was also suppressed in the composites. The composite fabrication can be extended to hybrid LHP: the Co-based a$_g$ZIF-62 can preserve the metastable black phase of FAPbI$_3$ (FA: formamidinium) at ambient conditions, showing PL emission in the red-to-infrared region.

Example 10—Practical Applications

Figure 10:
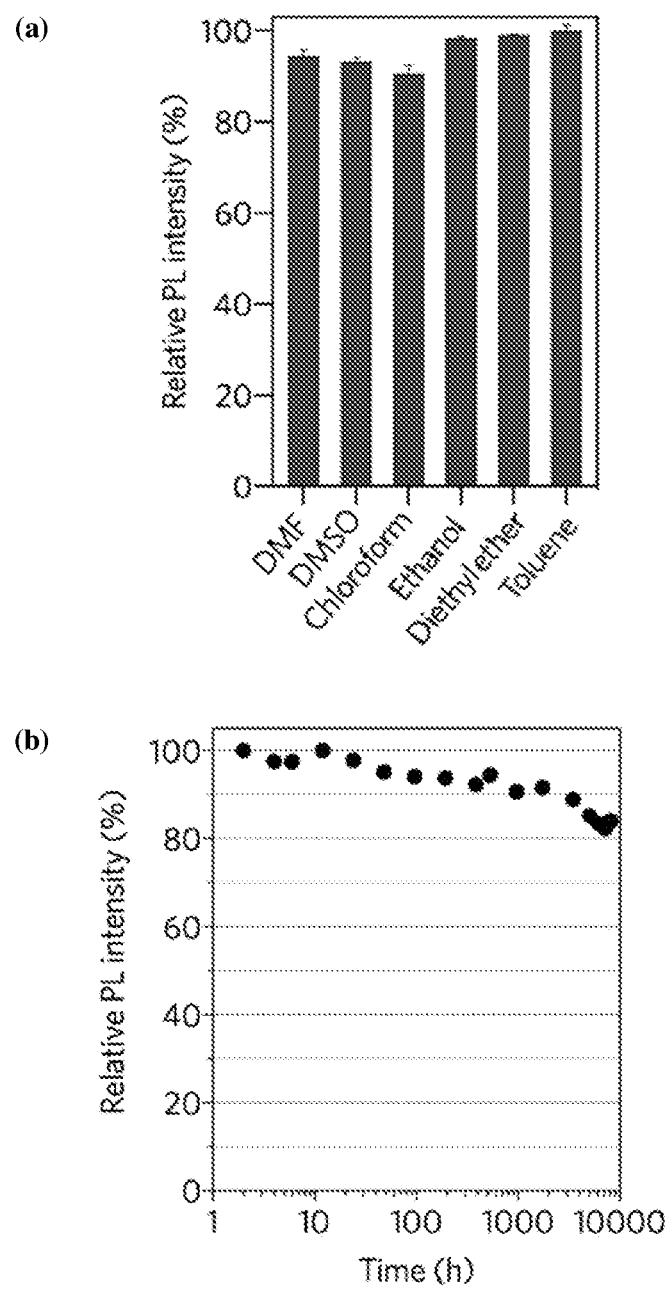

The hydrophobic, mechanically robust a$_g$ZIF-62 can provide satisfactory protection for the perovskite. The (CsPbI$_3$)$_{0.25}$(a$_g$ZIF-62)$_{0.75}$ PL spectra were largely invariant during 100 cycles of repeated measurement, due to the suppression of unfavourable photo-induced ion migration. The composites can withstand extended (ca. 20 h) sonication in various of nonpolar, polar protic, polar aprotic organic solvents, even when the polypropylene cap showed a certain level of swelling (FIG. 10($a$)), and the composite exhibited chemical resistance against water even after soaking for 10,000 hours (FIG. 10($b$)).

Mild heating also had little influence on the composite: 1000 cycles of repeated heating to 100° C. in Ar or 80° C. in the air did not significantly compromise their optical properties. The processible, rigid substrate enabled the shaping of the composite into different macroscopic structures. Therefore, the CGC showed good promise for the fabrication of stable PL LEDs.

Figure 11:
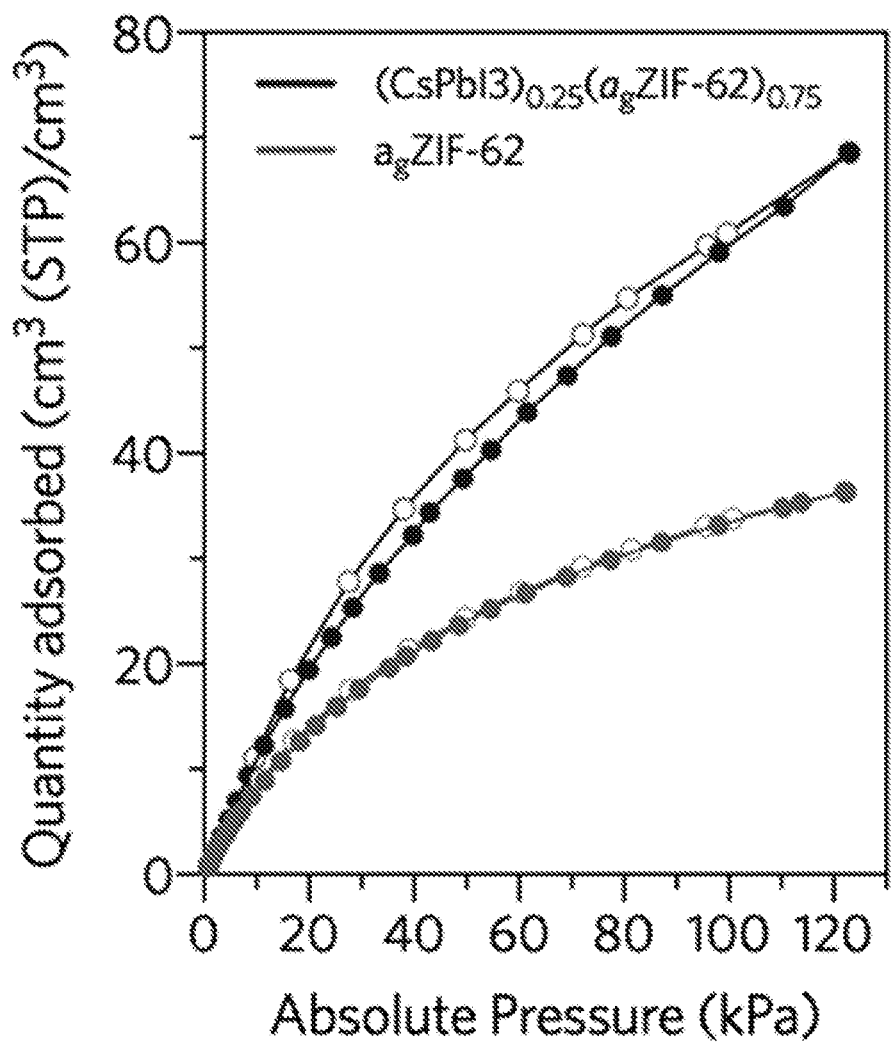
FIG. 11 shows (F) CO$_2$ adsorption isotherms at 273 K of a$_g$ZIF-62 and (CsPbI$_3$)$_{0.25}$(a$_g$ZIF-62)$_{0.75}$ sintered to 325° C., in which adsorption and desorption data points are shown as closed and open symbols, respectively.

The microposity of a$_g$ZIF-62 (FIG. 11) enabled a high adsorptive capacity of 10-times of Pb$^{2+}$ relative to its weight. Therefore, the (CsPbI$_3$)$_{0.25}$(a$_g$ZIF-62)$_{0.75}$ glass composite displays self-Pb sequestration, and the Pb$^{2+}$ concentration in the aqueous phase was below the detection limit of 0.5 ppm by inductively coupled plasma-optical emission spectrometry (ICP-OES) after the 10,000 h soaking test.

Figure 12:
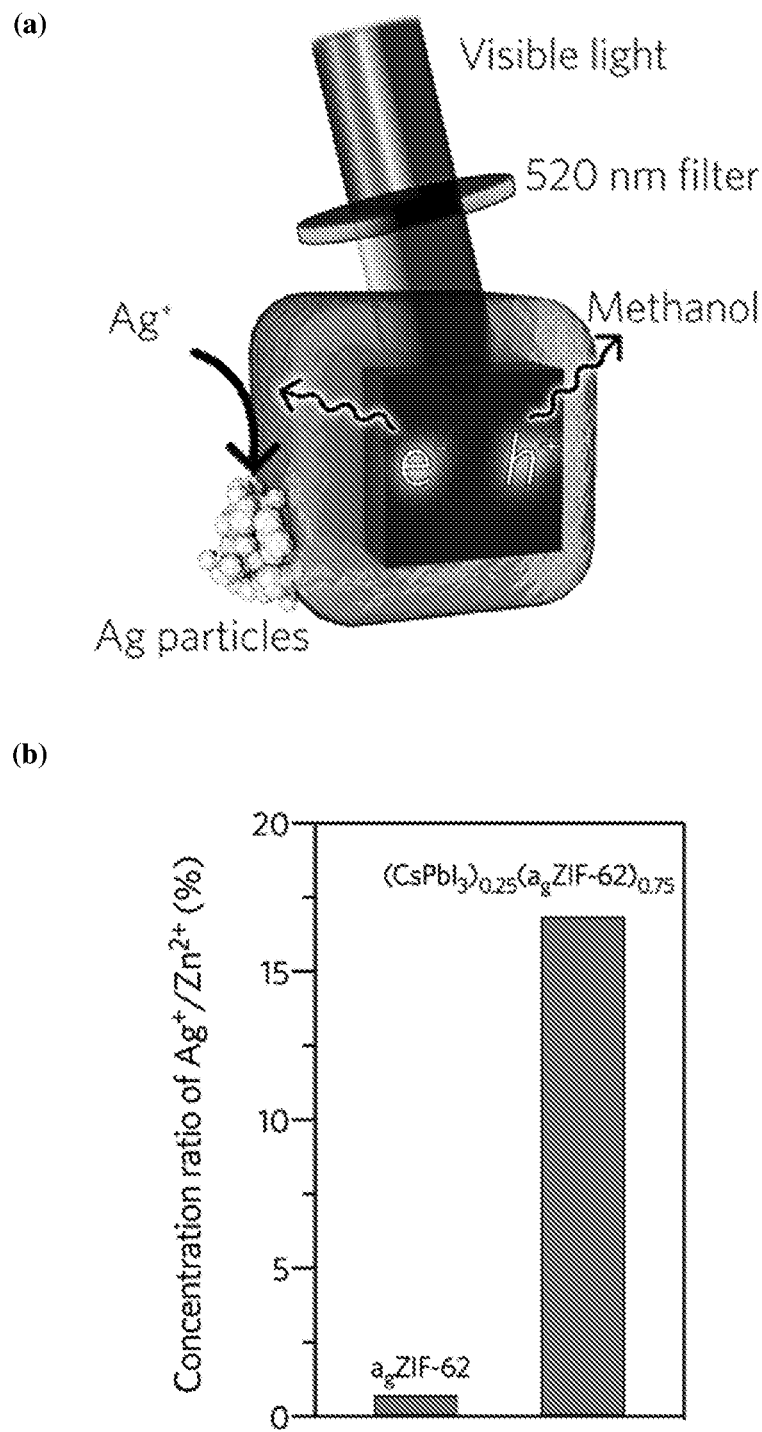
FIG. 12 shows (G) schematic diagram of an embodiment MOF glass composite used as photocatalytic material, and (H) Ag$^+$/Zn$^+$ concentration ratio (%) measured after photodeposition test by inductively coupled plasma-optical emission spectrometry (ICP-OES) using pure a$_g$ZIF-62 relative to a (CsPbI$_3$)$_{0.25}$(a$_g$ZIF-62)$_{0.75}$ glass composite sample.

The aqueous stability and safety open significant opportunities for liquid photocatalysis. As a demonstration, the (CsPbI$_3$)$_{0.25}$(a$_g$ZIF-62)$_{0.75}$ can effectively reduce aqueous Ag ions under excitation with visible light at a wavelength>520 nm, while the pure glass showed no photoactivity at this low excitation energy (FIGS. 12($a$) and 12($b$)).

Throughout this specification and the claims which follow, unless the context requires otherwise, the word "comprise", and variations such as "comprises" and "comprising", will be understood to imply the inclusion of a stated integer or step or group of integers or steps but not the exclusion of any other integer or step or group of integers or steps.

The reference in this specification to any prior publication (or information derived from it), or to any matter which is known, is not, and should not be taken as an acknowledgment or admission or any form of suggestion that that prior publication (or information derived from it) or known matter forms part of the common general knowledge in the field of endeavour to which this specification relates.

The invention claimed is:

1. A metal organic framework (MOF) glass composite comprising metal halide perovskite.

2. The composite of claim 1, wherein the MOF is a zeolitic imidazolate framework (ZIF).

3. The composite of claim 2, wherein the ZIF is a mixed-ligand ZIF.

4. The composite of claim 3, wherein the ZIF is a mixed-ligand halogenated ZIF.

5. The composite of claim 2, wherein the MOF is selected from ZIF-4, ZIF-62, ZIF-76, ZIF-UC-2, ZIF-UC-3, ZIF-UC-4, ZIF-UC-5, and a combination thereof.

6. The composite of claim 1, wherein the metal halide perovskite is one or more of lead halide perovskite, tin halide perovskite, germanium halide perovskite, and silver-bismuth halide double perovskite.

7. The composite of claim 1, wherein the metal halide perovskite is a mixed-halide metal halide perovskite.

8. The composite of claim 1, wherein the metal halide perovskite comprises one or more of α-, β- and γ-phase metal halide perovskite.

9. The composite of claim 1, wherein the metal halide perovskite is lead halide perovskite.

10. The composite of claim 1, wherein the metal halide perovskite is one or more of CsPbI3, CsPbBr3, CsPbCl2Br, CsPbCl1.5Br1.5, MAPbI3, MAPbBr3, FAPbI3, (C4H9NH3)2PbBr4, CsPbCl2Br, CsPbCl1.5Br1.5, CsPbClBr2, CsPbCl0.75Br2.25, CsPbCl0.5Br2.5, CsPbBr2.5I0.5, CsPbBr2.25I0.75, CsPbBr2I, CsPbBr1.5I1.5, CsPbBrI2, CsPbBr44–, (MAPbI3)0.95 (FAPbI3)0.05, MASnI3, FASnI3), and MASnIBr2, in which MA is methylammonium and FA is formamidinium.

11. The composite of claim 9, wherein the metal halide perovskite comprises one or more of α-, β-, and γ-phase CsPbI3 perovskite.

12. The composite of claim 1, comprising at least about 1% metal halide perovskite by weight, relative to the total weight of the MOF glass composite.

13. The composite of claim 12, comprising about 25% metal halide perovskite by weight, relative to the total weight of the MOF glass composite.

14. A method of making a MOF glass composite comprising metal halide perovskite, the method comprising the steps of:
    blending MOF and the metal halide perovskite to obtain a precursor blend,
    sintering the precursor blend such that the MOF liquefies and coats the metal halide perovskite, and
    quenching the sintered precursor blend so as to vitrify the liquefied MOF and form the MOF glass composite.

15. The method of claim 14, wherein the MOF in the blending step is at least one of crystalline MOF and MOF glass.

16. The method of claim 15, wherein the MOF in the blending step is a zeolitic imidazolate framework (ZIF).

17. The method of claim 14, wherein the precursor blend contains at least 1% by weight of metal halide perovskite.

18. The method of claim 17, wherein the precursor blend is sintered to a sintering temperature of at least 150° C.

19. The method of claim 18, wherein the sintered precursor blend is quenched at a quenching rate of at least 20° C./minute.

20. The method of claim 14, wherein quenching is cryogenic quenching.

\* \* \* \* \*